United States Patent
Yamaguchi et al.

(10) Patent No.: US 12,011,777 B2
(45) Date of Patent: Jun. 18, 2024

(54) LASER PROCESSING APPARATUS, LASER PROCESSING METHOD, AND METHOD FOR MANUFACTURING SEMICONDUCTOR DEVICE

(71) Applicant: JSW AKTINA SYSTEM CO., LTD., Yokohama (JP)

(72) Inventors: Yoshihiro Yamaguchi, Yokohama (JP); Miki Sawai, Yokohama (JP); Sadao Tanigawa, Yokohama (JP); Hirotaka Sazuka, Yokohama (JP); Naoyuki Kobayashi, Yokohama (JP)

(73) Assignee: JSW AKTINA SYSTEM CO., LTD, Yokohama (JP)

( * ) Notice: Subject to any disclaimer, the term of this patent is extended or adjusted under 35 U.S.C. 154(b) by 193 days.

(21) Appl. No.: 16/768,681

(22) PCT Filed: Oct. 30, 2018

(86) PCT No.: PCT/JP2018/040223
§ 371 (c)(1),
(2) Date: May 31, 2020

(87) PCT Pub. No.: WO2019/138659
PCT Pub. Date: Jul. 18, 2019

(65) Prior Publication Data
US 2021/0187659 A1  Jun. 24, 2021

(30) Foreign Application Priority Data
Jan. 11, 2018  (JP) .................................. 2018-002460

(51) Int. Cl.
*B23K 26/03* (2006.01)
*B23K 26/50* (2014.01)
(Continued)

(52) U.S. Cl.
CPC ............ *B23K 26/032* (2013.01); *B23K 26/50* (2015.10); *H01L 21/268* (2013.01); *B23K 2101/40* (2018.08)

(58) Field of Classification Search
CPC .... B23K 26/0626; B23K 26/60; B23K 26/14; B23K 26/342; B23K 26/0884;
(Continued)

(56) References Cited

U.S. PATENT DOCUMENTS 5,821,497 A * 10/1998 Yamazaki .......... B23K 26/0838
                                                 219/121.73
2003/0168437 A1   9/2003 Tanaka
(Continued)

FOREIGN PATENT DOCUMENTS

CN        1421901 A        6/2003
JP      60110114 A  *   6/1985   ............. H01L 21/18
(Continued)

OTHER PUBLICATIONS

International Search Report from International Patent Application No. PCT/JP2018/040223, dated Jan. 29, 2019.
(Continued)

*Primary Examiner* — Dana Ross
*Assistant Examiner* — Adam M Eckardt
(74) *Attorney, Agent, or Firm* — Potomac Law Group, PLLC

(57) ABSTRACT

A laser processing apparatus (1) according to an embodiment includes a processing chamber (18) configured to perform laser processing for an object to be processed (40), a stage (10) disposed inside the processing chamber (18), the stage being configured to convey the object to be processed (40), and a control unit (50) configured to instruct a loading/unloading apparatus (30) about a placement position of the object to be processed (40) over the stage (10), the loading/
(Continued)

unloading apparatus (30) being configured to load/unload the object to be processed (40) into/from the processing chamber (18). Further, the processing chamber (18) includes a loading gate (17*a*) for loading and an unloading gate (17*b*) for unloading for the object to be processed (40), and the object to be processed (40) is conveyed only in a first direction from the loading gate (17*a*) toward the unloading gate (17*b*) over the stage (10).

14 Claims, 21 Drawing Sheets

(51) Int. Cl.
*B23K 101/40* (2006.01)
*H01L 21/268* (2006.01)

(58) Field of Classification Search
CPC ........... B23K 26/0093; B23K 26/1476; B23K 26/34; B23K 26/144; B23K 35/3033; B23K 1/0018; B23K 26/3584; B23K 35/304; B23K 1/206; B23K 26/361; B23K 1/20; B23K 31/02; B23K 26/32; B23K 20/1205; B23K 20/16; B23K 9/167; B23K 10/027; B23K 9/048; B23K 9/173; B23K 5/18; B23K 35/308; B23K 35/0244; B23K 35/3086; B23K 35/007; B23K 2101/40; B23K 26/032; B23K 26/082; B23K 26/0838; B23K 26/123; B23K 26/50; B23K 26/03; B23H 9/10; B23H 1/00; B22F 5/04; B22F 10/20; B22F 7/08; B22F 7/062; B22F 5/009; B22F 3/24; B22F 2003/026; B22F 3/03; B22F 3/035; B33Y 80/00; B33Y 10/00; B33Y 50/00; B33Y 40/00; B33Y 30/00; F01D 5/005; F01D 5/20; F01D 5/18; B23P 6/007; B23P 6/002; B23P 6/005; B23P 6/00; B23P 6/045; B23P 15/02; B23Q 17/2471; G05B 19/31; G05B 19/4097; B24B 19/14; C22C 19/056; F05D 2230/31; F05D 2230/80; B30B 11/00; B30B 11/02; B30B 15/0011; B30B 15/0088; B30B 15/00; C10M 171/02; H01L 21/20; H01L 21/268; H01L 21/677; H01L 27/3244; H01L 29/786; H01L 21/336; H01H 13/702; H01H 13/703; H01H 2211/016; H01H 13/712; B62D 7/14; C10N 20/02; C10N 30/06; C10N 40/24; A01B 69/00
See application file for complete search history.

(56) References Cited

U.S. PATENT DOCUMENTS

| | | |
|---|---|---|
| 2003/0171837 A1 | 9/2003 | Yamazaki et al. |
| 2003/0183876 A1 | 10/2003 | Takafuji et al. |
| 2003/0224550 A1 | 12/2003 | Kokubo et al. |
| 2005/0040412 A1 | 2/2005 | Kokubo et al. |
| 2006/0244940 A1 | 11/2006 | Uehara |
| 2009/0213347 A1* | 8/2009 | Sugihara ............ G03F 7/70741 414/800 |
| 2017/0221712 A1* | 8/2017 | Kudo .................. B23K 26/352 |
| 2018/0315633 A1 | 11/2018 | Shimizu et al. |
| 2019/0001442 A1* | 1/2019 | Unrath ................ B23K 26/082 |
| 2019/0198326 A1* | 6/2019 | Mikami ............. H01L 21/6838 |

FOREIGN PATENT DOCUMENTS

| | | | | |
|---|---|---|---|---|
| JP | S60-110114 A | | 6/1985 | |
| JP | S60110114 A | * | 6/1985 | |
| JP | 2000-349041 A | | 12/2000 | |
| JP | 2000349041 A | * | 12/2000 | |
| JP | 2002-280321 A | | 9/2002 | |
| JP | 2002280321 A | * | 9/2002 | |
| JP | 2003-197521 A | | 7/2003 | |
| JP | 2003-243321 A | | 8/2003 | |
| JP | WO2015174347 A1 | * | 6/2017 | ........... H01L 21/265 |
| TW | 200306002 A | | 11/2003 | |
| TW | 200514133 A | | 4/2005 | |
| WO | WO 2012/046478 A1 | | 4/2012 | |
| WO | WO 2014/148182 A1 | | 9/2014 | |
| WO | WO 2015/174347 A1 | | 11/2015 | |
| WO | WO-2015174347 A1 | * | 11/2015 | ............. B23K 26/00 |
| WO | WO 2017/044646 A1 | | 3/2017 | |
| WO | WO 2017/073573 A1 | | 5/2017 | |
| WO | WO 2018/055840 A1 | | 3/2018 | |
| WO | WO-2018055840 A1 | * | 3/2018 | ........... B65G 49/065 |

OTHER PUBLICATIONS

Office Action dated Sep. 1, 2023, in Chinese Patent Application No. 201880085876.7.

* cited by examiner

LASER PROCESSING APPARATUS, LASER PROCESSING METHOD, AND METHOD FOR MANUFACTURING SEMICONDUCTOR DEVICE

TECHNICAL FIELD

The present invention relates to a laser processing apparatus, a laser processing method, and a method for manufacturing a semiconductor device. For example, the present invention relates to a laser processing apparatus, a laser processing method, and a method for manufacturing a semiconductor device, in which the semiconductor device is manufactured by irradiating it with laser light.

BACKGROUND ART

Patent Literature 1 discloses a laser processing apparatus for crystalizing an amorphous film formed over a silicon substrate, a glass substrate, or the like by irradiating it with laser light.

CITATION LIST

Patent Literature

Patent Literature 1: International Patent Publication No. WO2015/174347

SUMMARY OF INVENTION

Technical Problem

As the size of displays of television sets and the like has been increasing, the size of glass substrates and the like used for the manufacturing of panels has been increasing. Further, there is a trend toward increasing the size of glass substrates and the like in order to increase the number of panels that can be obtained from one glass substrate or the like. As the size of objects to be processed, such as glass substrates, has been increasing, various problems have arisen in laser processing processes for such objects to be processed performed in the panel manufacturing process.

Other problems to be solved and novel features will become apparent from descriptions in this specification and accompanying drawings.

Solution to Problem

A laser processing apparatus according to an embodiment includes a control unit configured to instruct a loading/unloading apparatus about a placement position of an object to be processed, the loading/unloading apparatus being configured to unload the object to be processed.

A laser processing method according to an embodiment includes the steps of: instructing a loading/unloading apparatus about a placement position of an object to be processed, the loading/unloading apparatus being configured to unload the object to be processed; and performing laser processing for the object to be processed.

A method for manufacturing a semiconductor device according to an embodiment includes the steps of: instructing a loading/unloading apparatus about a placement position of a substrate, the loading/unloading apparatus being configured to unload the substrate; and performing laser processing for the substrate.

DESCRIPTION OF EMBODIMENTS

Embodiment

A laser processing apparatus according to an embodiment will be described. Firstly, a configuration of the laser processing apparatus will be described. Next, a loading/unloading apparatus that loads/unloads an object to be processed onto/from a laser processing apparatus and the object to be processed in the laser processing apparatus will be described. After that, a laser processing method using the laser processing apparatus will be described.

<Configuration of Laser Processing Apparatus>

Figure 1:
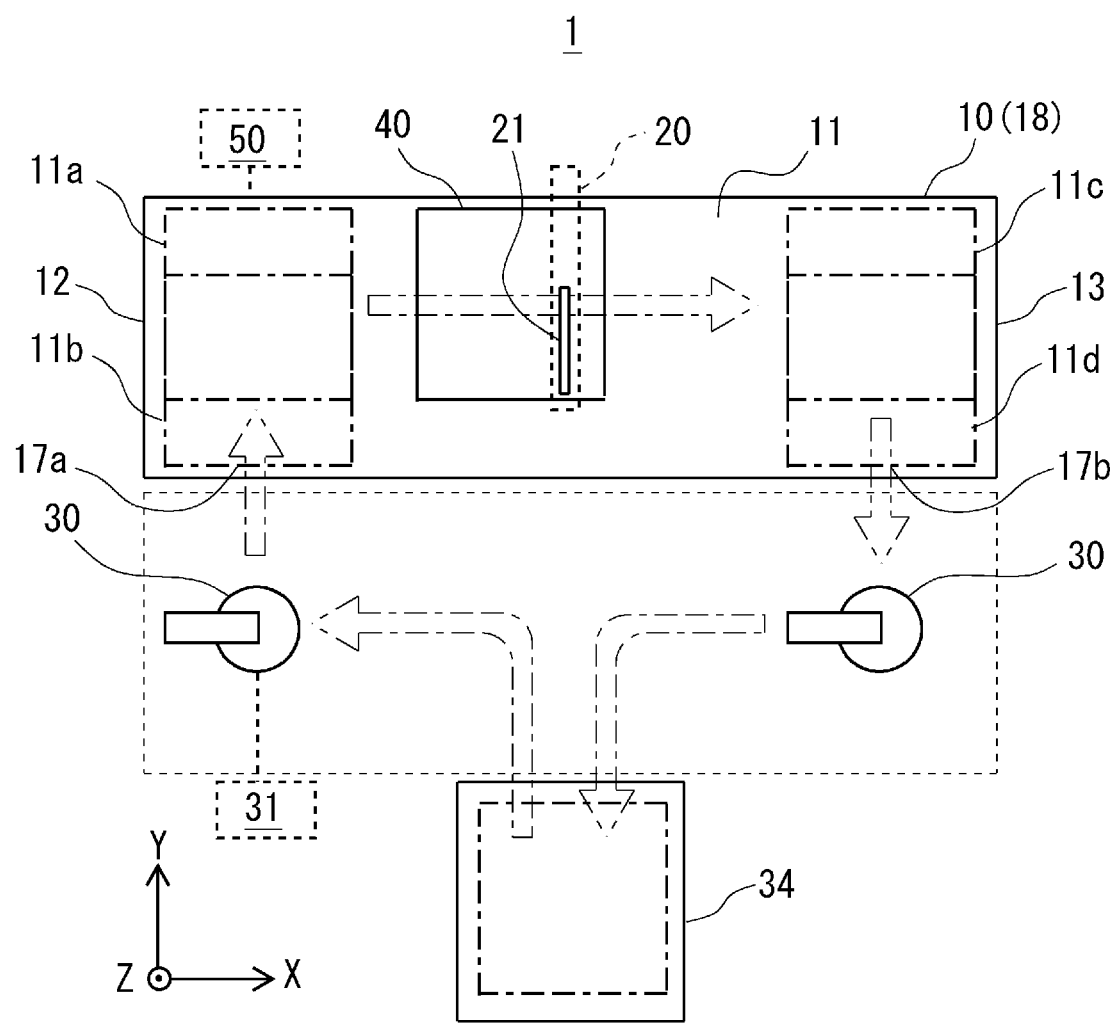
FIG. 1 is a plan view showing an example of a laser processing apparatus according to an embodiment.
Figure 2:
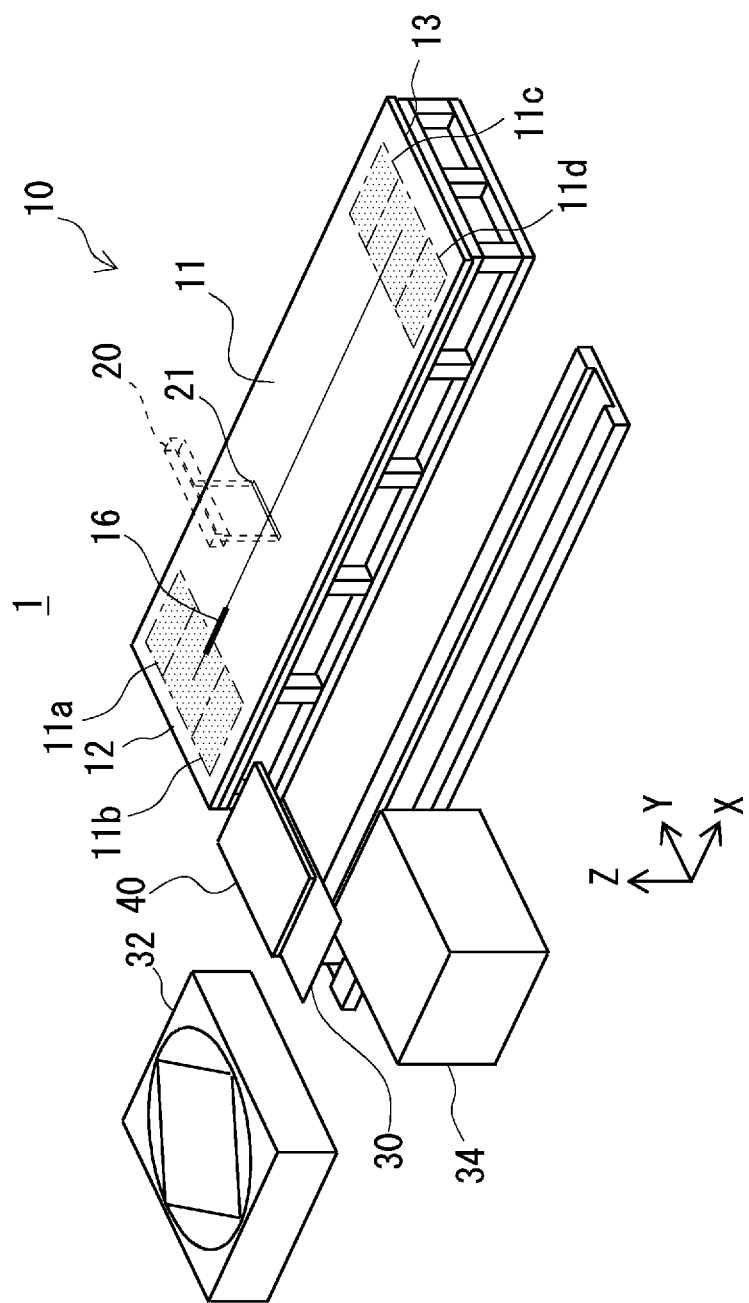
FIG. 2 is a perspective view showing an example of a laser processing apparatus according to an embodiment.

FIG. 1 is a plan view showing an example of a laser processing apparatus according to an embodiment. FIG. 2 is a perspective view showing the example of the laser processing apparatus according to the embodiment. As shown in FIGS. 1 and 2, the laser processing apparatus 1 includes a processing chamber 18, a stage 10, and a laser irradiation unit 20.

The processing chamber 18 is, for example, a rectangular parallelepiped housing with an internal space formed therein. Laser processing is performed for an object to be processed 40 inside the processing chamber 18. As described above, the processing chamber 18 is provided to perform the laser processing for the object to be processed 40 therein. The processing chamber 18 includes a loading gate 17a through which the object to be processed 40 is carried in and an unloading gate 17b through which the object to be processed 40 is carried out.

The stage 10 has, for example, a rectangular parallelepiped shape and has a top surface 11 extending in one direction. The stage 10 is disposed inside the processing chamber 18. The stage 10 is provided for conveying the object to be processed 40.

Note that for the sake of explanation of the laser processing apparatus 1, an XYZ-orthogonal coordinate system is introduced. One direction in a plane parallel to the top surface 11 is defined as an X-axis direction. In the plane parallel to the top surface 11, another direction orthogonal to the X-direction is defined as a Y-axis direction. A direction orthogonal to the top surface 11 is defined as a Z-axis direction. Regarding the Z-axis direction, for example, an upward direction is defined as a Z-axis positive direction and a downward direction is defined as a Z-axis negative direction.

The stage 10 is used for laser processing in which the object to be processed 40 is irradiated with laser light. In the stage 10, the object to be processed 40 is moved from a vicinity 12 of one end of the top surface 11 to a vicinity 13 of the other end thereof along the X-axis direction over the top surface 11. For example, a vicinity of the end of the top surface 11 on the X-axis direction negative side in the X-axis direction is referred to as the vicinity 12 of one end. A vicinity of the end of the top surface 11 on the X-axis direction positive side in the X-axis direction is referred to as the vicinity 13 of the other end.

To move the object to be processed 40 from the vicinity 12 of one end of the top surface 11 to the vicinity 13 of the other end thereof is referred to as conveyance. The loading gate 17a of the processing chamber 18 is disposed in the vicinity 12 of one end and the unloading gate 17b is disposed in the vicinity 13 of the other end. A direction from the loading gate 17a toward the unloading gate 17b over the stage 10 is referred to as a first direction. For example, the first direction is the X-axis positive direction. The object to be processed 40 is conveyed only in the first direction from the loading gate 17a to the unloading gate 17b over the stage 10. Over the stage 10, the object to be processed 40 may be conveyed while being levitated over the top surface 11. For example, a plurality of minute holes are formed in the top surface 11. Further, air is ejected upward from the minute holes of the top surface 11. The object to be processed 40 disposed over the top surface 11 is conveyed while being levitated over the stage 10 by the air ejected from the holes.

The object to be processed 40 is moved in the X-axis positive direction in the X-axis direction over the top surface 11 of the stage 10. The stage 10 may not include a mechanism for moving the object to be processed 40 in the X-axis negative direction in the X-axis direction and in the Y-axis positive and negative directions in the Y-axis direction. Note that the stage 10 may include an alignment apparatus for finely adjusting the position of the object to be processed 40 disposed over the top surface 11.

A first position 11a and a second position 11b are set in the vicinity 12 of one end in the X-axis direction over the top surface 11 as placement positions of the object to be processed 40. The second position 11b is displaced from the first position 11a by a predetermined length in the Y-axis direction. For example, when the X-axis positive direction is defined as the first direction, the Y-axis direction is referred to as a second direction intersecting the first direction. For example, the first position 11a is displaced from the second position 11b in the second direction (toward the Y-axis direction positive side). A part of the first position 11a overlaps a part of the second position 11b over the top surface 11 of the stage 10. Note that placement positions for the object to be processed 40 other than the first and second positions 11a and 11b may be set in the vicinity 12 of one end.

A third position 11c and a fourth position 11d are set in the vicinity 13 of the other end in the X-axis direction over the top surface 11. The fourth position 11d is displaced from the third position 11c by a predetermined length in the Y-axis direction. For example, the third position 11c is displaced from the fourth position 11d toward the Y-axis direction positive side. A part of the third position 11c overlaps a part of the fourth position 11d over the top surface 11 of the stage 10. Note that placement positions for the object to be processed 40 other than the third and fourth positions 11c and 11d may be set in the vicinity 13 of the other end.

The third position 11c is a position to which the object to be processed 40 is moved from the first position 11a along the X-axis direction. The fourth position 11d is a position to which the object to be processed 40 is moved from the second position 11b along the X-axis direction.

Figure 3:
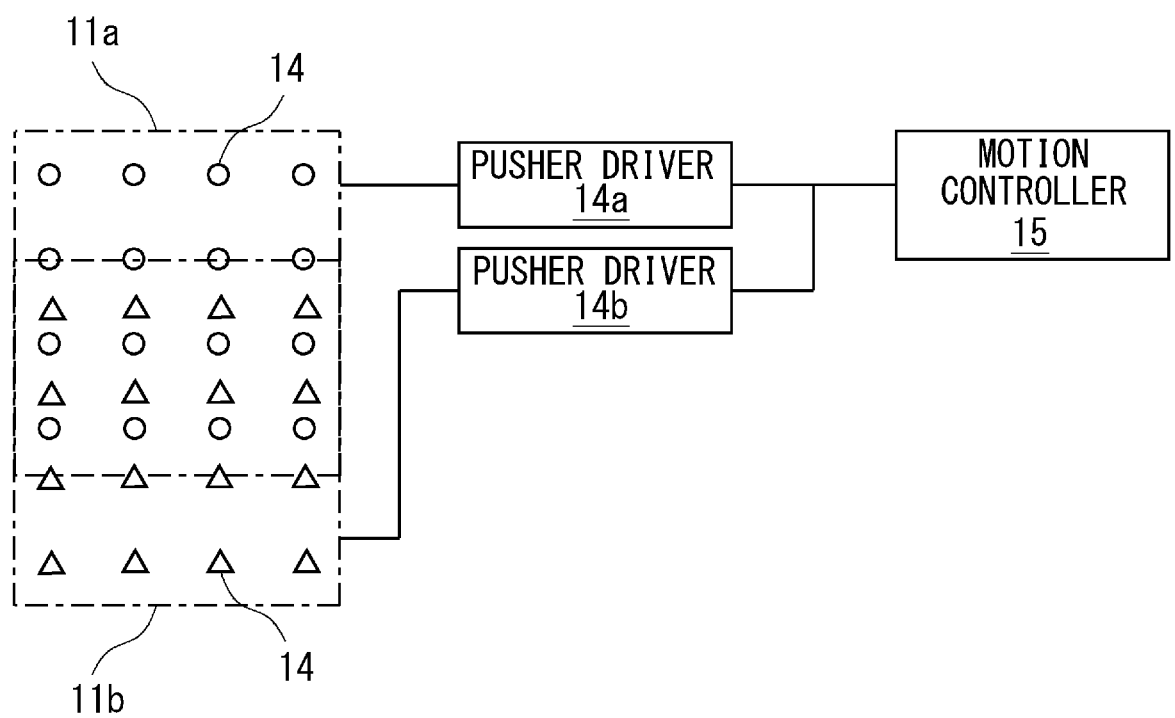
FIG. 3 is a plan view showing an example of pusher pins of a laser processing apparatus according to an embodiment.
Figure 4:
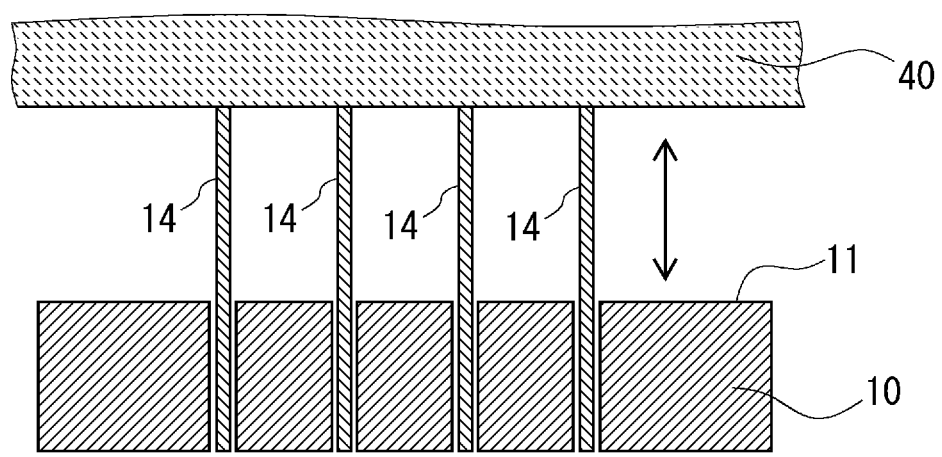
FIG. 4 is a cross-sectional view showing an example of pusher pins of a laser processing apparatus according to an embodiment.

FIG. 3 is a plan view showing an example of pusher pins of a laser processing apparatus according to an embodiment. FIG. 4 is a cross-sectional view showing the example of the pusher pins of the laser processing apparatus according to the embodiment. FIG. 3 shows a block diagram in addition to the plan view. As shown in FIGS. 3 and 4, the stage 10 may include pusher pins 14. Each pusher pin 14 is a pin-like member extending in the Z-axis direction. The tip of the pusher pin 14 rises and falls relative to the top surface 11 of the stage 10.

The plurality of pusher pins 14 protrude from the top surface 11 of the stage 10. An object to be processed 40 is held by the plurality of pusher pins 14. The pusher pins 14 function as holding means for the object to be processed 40. Specifically, the plurality of pusher pins 14 function as a loading holding part which is used when a loading/unloading apparatus 30 loads an object to be processed 40, and as an unloading holding part which is used when the loading/ unloading apparatus 30 unloads the object to be processed 40. The pusher pins 14 are provided in at least one of the first and second positions 11a and 11b over the top surface 11 of the stage 10. For example, the pusher pins 14 protrude from the top surface 11 in the first and second positions 11a and 11b. In this way, the pusher pins 14 lifts the object to be processed 40. Note that the loading holding part and the unloading holding part provided in the stage 10 are not limited to the pusher pins 14. That is, they may be bars or a plurality of grooves as described later.

When the object to be processed 40 is moved along the X-axis direction, the pusher pins 14 are accommodated below the top surface 11. The movement of the pusher pins 14 in the first position 11a is controlled by a first pusher pin driver 14a. The movement of the pusher pins 14 in the second position 11b is controlled by a second pusher pin driver 14b. The first and second pusher pin drivers 14a and 14b are controlled by a motion controller 15. The plurality of pusher pins 14 located in the first position 11a and the plurality of pusher pins 14 located in the second position 11b may be simultaneously raised and lowered. Alternatively, only those located in the first position 11a or those located in the second position 11b may be raised and lowered.

As shown in FIG. 2, the stage 10 may include a grasping part 16 for grasping the object to be processed 40. The grasping part 16 is disposed in the top surface 11 of the stage 10. The grasping part 16 is, for example, a vacuum chuck. The grasping part 16 is moved along a groove extending in the X-axis direction. The grasping part 16 sucks the bottom surface of the object to be processed 40. Then, the grasping part 16 conveys the object to be processed 40 in the X-axis direction. Note that the means for conveying the object to be processed 40 in the X-axis direction is not limited to the grasping part 16.

After the pusher pins 14 located in the first and second positions 11a and 11b are accommodated in the stage 10, the grasping part 16 grasps the object to be processed 40. In the first and second positions 11a and 11b, the pusher pins 14 may be accommodated in the stage 10 in such a manner that the closer they are located to the grasping part 16, the earlier they are accommodated in the stage 10.

If the pusher pins 14 are accommodated in the stage 10 in such a manner that the closer they are located to the grasping part 16, the later they are accommodated in the stage 10, there is a possibility that a peripheral part of the bottom surface of the object to be processed 40 comes into contact with the top surface 11 of the stage 10 earlier than the central part of the bottom surface does. As a result, some air is trapped between the central part of the bottom surface of the object to be processed 40 and the top surface 11 of the stage 10, thus forming a gap therebetween. In such a case, there is a possibility that the grasping part 16 cannot grasp the object to be processed 40.

In this embodiment, the pusher pins 14 are accommodated in the stage 10 in such a manner that the closer they are located to the grasping part 16, the earlier they are accommodated in the stage 10. Therefore, the formation of a gap between the object to be processed 40 and the top surface 11 is prevented. As a result, the grasping part 16 can grasp the object to be processed 40.

The stage 10 may be disposed inside the processing chamber 18, which includes the loading gate 17a and the unloading gate 17b. The unloading gate 17b is different from the loading gate 17a.

Figure 5:
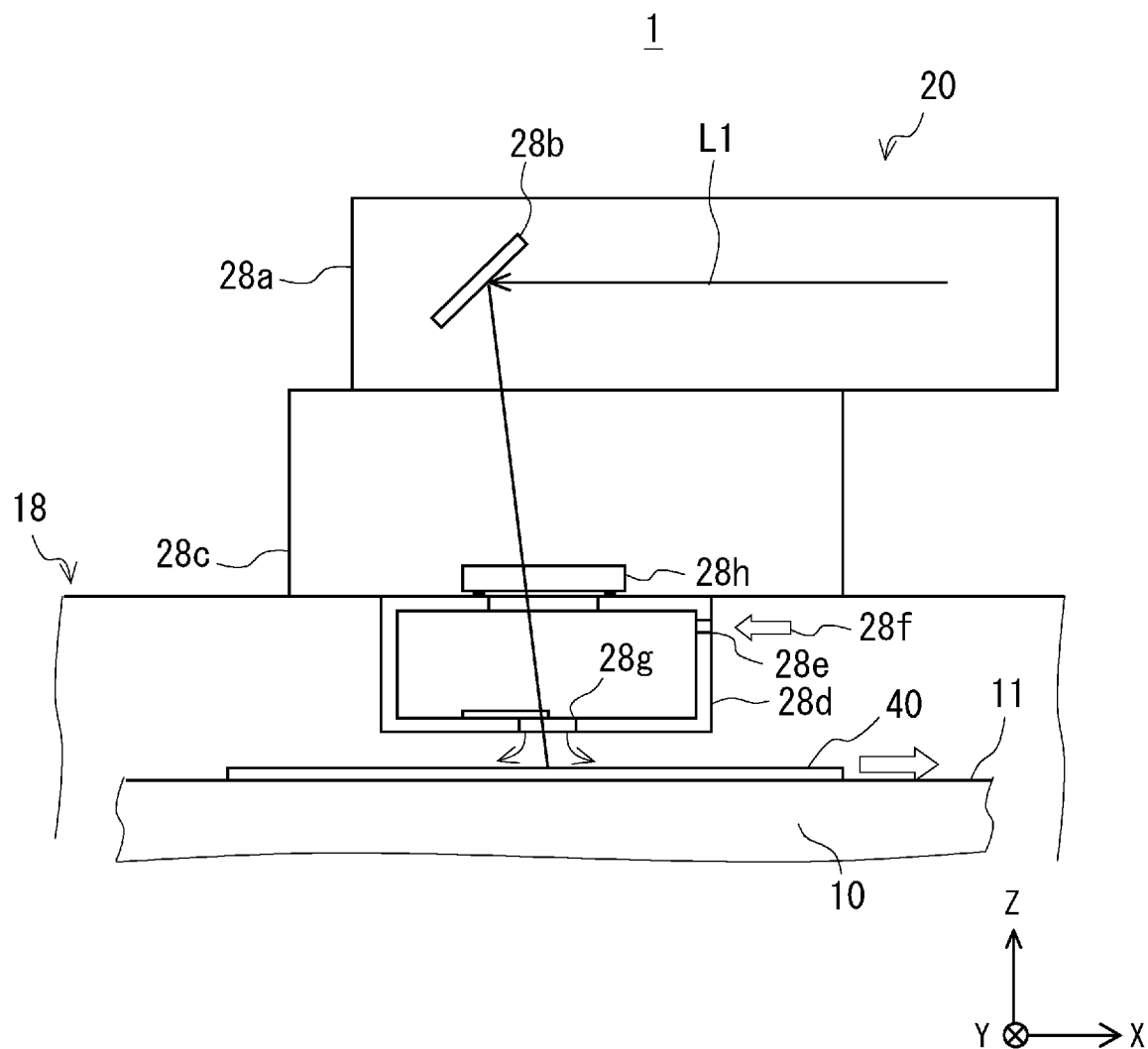
FIG. 5 is a cross-sectional view showing an example of an optical path of laser light of a laser processing apparatus according to an embodiment.

FIG. 5 is a cross-sectional view showing an example of an optical path of laser light in a laser processing apparatus 1 according to an embodiment. As shown in FIG. 5, a laser irradiation unit 20 applies laser light L1 to an object to be processed 40. For example, the laser irradiation unit 20 applies the laser light L1 to an object to be processed 40 moving over the top surface 11 of the stage 10. The laser irradiation unit 20 includes a laser oscillator (not shown) and an optical member(s) for guiding the laser light L1 emitted from the laser oscillator onto the stage 10. The laser irradiation unit 20 is disposed in a position where it can receive the laser light L1 emitted from the laser oscillator.

The laser light L1 travels, for example, in the X-axis negative direction and enters the laser irradiation unit 20. Note that if necessary, an optical element(s) such as an attenuator for adjusting the energy density of the laser light L1 may be disposed between the light source and the laser irradiation unit 20 in the optical path of the laser light L1.

The laser irradiation unit 20 includes an optical system housing 28a constituting an exterior thereof, a mirror 28b, an optical element such as a lens, and an enclosed part 28c. The laser irradiation unit 20 adjusts the direction in which the laser light L1 emitted from the light source is applied, the amount of the laser light, and the like. The enclosed part 28c is disposed below the optical system housing 28a. After being adjusted by the laser irradiation unit 20, the laser light L1 is made to enter the processing part 18 through the enclosed part 28c and a sealing window 28h.

The laser light L1 is shaped into a line beam shape in the laser irradiation unit 20. That is, the laser light L1 is shaped into a long and narrow linear shape extending in one direction. For example, a cross section of the laser light L1, which has been reflected on the mirror 28b, perpendicular to the optical axis thereof has a linear shape extending in the Y-axis direction. The laser light L1 has, for example, a shape of a line beam 21 extending in the Y-axis direction over the top surface of the object to be processed 40. The length of the line beam 21 in the Y-axis direction is, for example, about 1,500 [mm] at the maximum. The length of the line beam 21 is adjusted, for example, by using a slit. The processing chamber 18 includes a gas box 28d and the stage 10.

A certain gas 28f, which is, for example, an inert gas such as nitrogen, is supplied to the gas box 28d through a gas inlet 28e. The gas 28f supplied to the gas box 28d is charged into inside the gas box 28d and then discharged from an irradiation window 28g. In the processing chamber 18, a laser annealing process in which the object to be processed 40 placed over the stage 10 is irradiated with the laser light L1 and its amorphous film is thereby crystalized is performed.

The laser processing apparatus 1 may include a control unit 50. As will be described later, the loading/unloading apparatus 30 may also include a loading/unloading control unit 31 that controls loading/unloading of the object to be processed 40. The control unit 50 instructs the loading/unloading apparatus 30 to place the object to be processed 40 in the first position 11a in the vicinity 12 of one end of the top surface 11 of the stage 10 inside the processing chamber 18, or in the second position 11b in the vicinity 12 of the one end thereof. Further, the control unit 50 may select the first position 11a or the second position 11b as the placement position of the object to be processed 40. The control unit 50 instructs the loading/unloading apparatus 30 about the selected placement position. As described above, the control unit 50 instructs the loading/unloading apparatus 30, which loads/unloads the object to be processed 40 into/from the processing chamber 18, about the placement position of the object to be processed 40 over the stage 10. A signal by which the control unit 50 indicates the placement position is referred to as a position control signal.

When the object to be processed 40 is placed over the stage 10, the control unit 50 makes the loading/unloading apparatus 30 carry in the object to be processed 40 through the loading gate 17a and place it over the top surface 11. When the object to be processed 40 is unloaded from the stage 10, the control part 50 makes the loading/unloading apparatus 30 carry out the object to be processed 40 through the unloading gate 17b.

Figure 6:
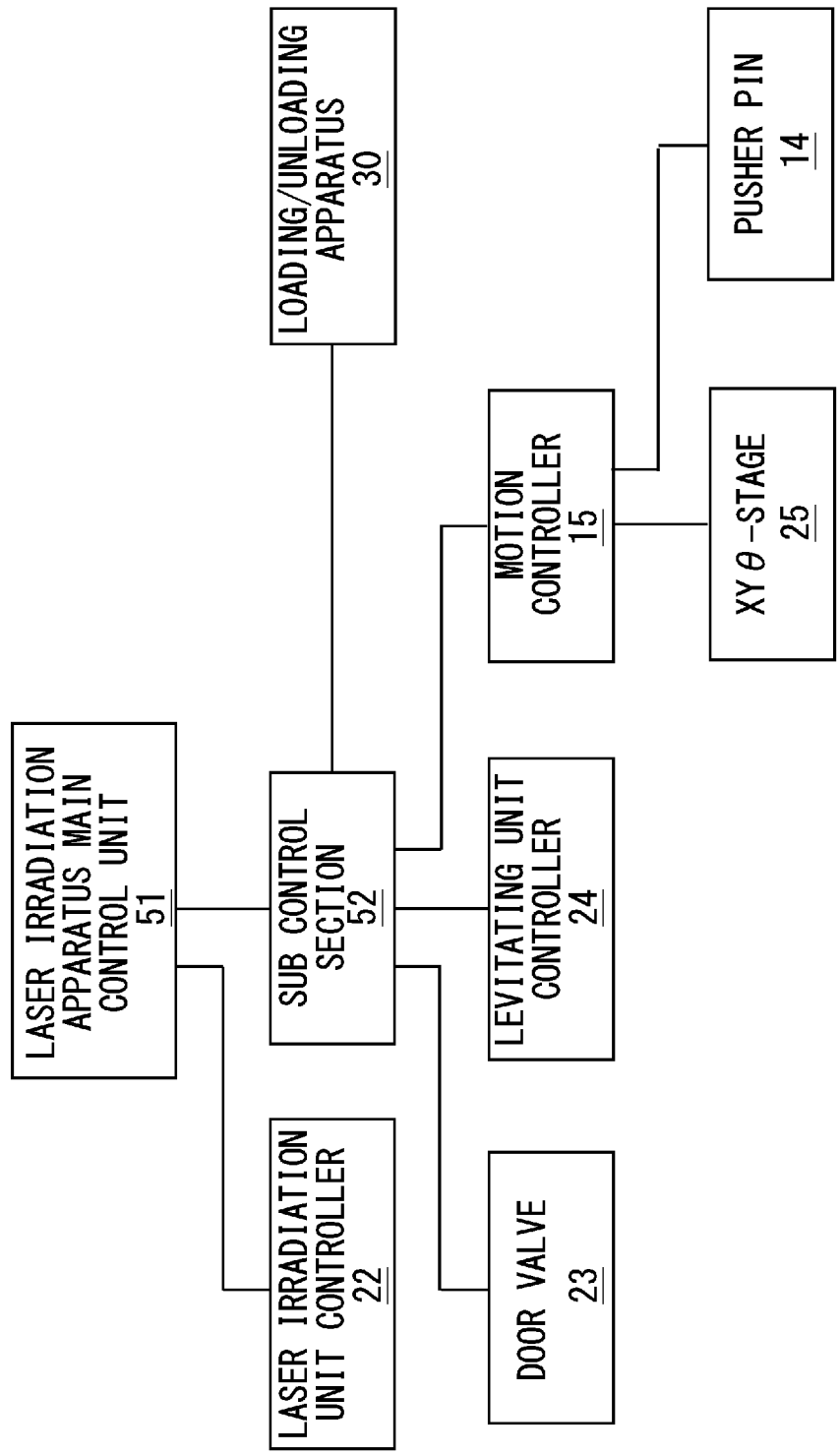
FIG. 6 is a block diagram showing an example of a communication system of a laser processing apparatus according to an embodiment.

FIG. 6 is a block diagram showing an example of a communication system of the laser processing apparatus 1 according to the embodiment. As shown in FIG. 6, a main control unit 51, a sub control unit 52, a laser irradiation unit controller 22, a loading/unloading apparatus 30, a door valve 23, a levitating unit controller 24, a motion controller 15, an XYθ-stage 25, and pusher pins 14 are connected to the communication system of the laser processing apparatus 1.

The main control unit 51 is, for example, a PC (Personal Computer). The sub control unit 52 is, for example, a ladder controller. The main control unit 51 and the sub control unit 52 may be integrally formed. The main control unit 51 and the sub control unit 52 are collectively referred to as a control unit 50. Further, each of the main control unit 51 and the sub control unit 52 is also referred to as a control unit 50.

The laser irradiation unit controller 22 controls the oscillation, the stop, the output, the wavelength, and the like of the laser light. The control unit 50 controls the oscillation, the stop, the output, the wavelength, and the like of the laser light by controlling the laser irradiation unit controller 22.

The control unit 50 controls the loading/unloading of an object to be processed 40 onto/from the stage 10. The control unit 50 controls the opening/closing of the loading gate 17a and the unloading gate 17b by controlling the door valve 23 of the processing chamber 18 with which the stage 10 is enclosed.

The levitating unit controller 24 controls the ejection of air from the holes formed in the top surface 11 of the stage 10. The control unit 50 controls the levitation of the object to be processed 40 over the top surface 11 by controlling the levitating unit controller 24.

The motion controller 15 controls the position and the movement of the object to be processed 40 over the top surface 11 of the stage 10. The motion controller 15 moves the object to be processed 40 in the X-axis positive direction over the top surface 11 of the stage 10. For example, the motion controller 15 moves the object to be processed 40 in the X-axis positive direction by controlling the grasping part 16 that grasps the object to be processed 40. Further, the motion controller 15 finely adjusts the position of the object to be processed 40, for example, by controlling the XYθ-stage 25. The motion controller 15 controls the rise and fall of the pusher pins 14 through the pusher pin drivers 14a and 14b.

<Loading/Unloading Apparatus>

Next, the loading/unloading apparatus 30 that loads/unloads an object to be processed 40 onto/from the laser processing apparatus 1 will be described.

The loading/unloading apparatus 30 loads and unloads the object to be processed 40. The loading/unloading apparatus 30 is, for example, a loading/unloading robot. The loading/unloading robot may be composed of a loading robot and an unloading robot. The loading/unloading apparatus 30 places the object to be processed 40 in the vicinity 12 of one end of the top surface 11 of the stage 10. Further, the loading/unloading apparatus 30 unloads the object to be processed 40 from the vicinity 13 of the other end of the top surface 11. Specifically, in response to an instruction from the control unit 50 of the laser processing apparatus 1, the loading/unloading 30 places the object to be processed 40 in the first position 11a or the second position 11b in the vicinity 12 of one end of the top surface 11 through the loading gate 17a. The loading/unloading apparatus 30 places the object to be processed 40 in one of the first and second positions 11a and 11b selected by the control unit 50 as the placement position of the object to be processed 40. As described above, the loading/unloading apparatus 30 can place the object to be processed 40 that has been carried in through the loading gate 17a at a predetermined position in the second direction intersecting the first direction. The predetermined position is determined according to the position control signal sent from the control unit 50.

The loading/unloading apparatus 30 includes a loading/unloading control unit 31 that controls the loading/unloading of the object to be processed 40. Further, when the loading/unloading control unit 31 is instructed to place the object to be processed 40 in the first position 11a or the second position 11b by the control unit 50 of the laser processing apparatus 1, the loading/unloading control unit 31 may select the first position 11a or the second position 11b as the placement position of the object to be processed 40. The loading/unloading control part 31 places the object to be processed 40 in the selected placement position. The control part 50 of the laser processing apparatus 1 controls each of the controllers so that the object to be processed 40 can be placed in the placement position selected by the loading/unloading control unit 31.

When the loading/unloading apparatus 30 unloads the object to be processed 40 from the top surface 11 of the stage 10, the loading/unloading apparatus 30 unloads the object to be processed 40 from the third position 11c in the vicinity 13 of the other end of the top surface 11 or the fourth position 11d near the vicinity 13 of the other end thereof. Specifically, the loading/unloading apparatus 30 unloads the object to be processed 40, which has been placed in the first position 11a, conveyed in the first direction, and disposed in the third position 11c. Further, the loading/unloading apparatus 30 unloads the object to be processed 40, which has been placed in the second position 11b, conveyed in the first direction, and disposed in the fourth position 11d. As described above, the position from which the object to be processed 40 is taken out changes according to the position in which the object to be processed 40 is placed by the loading/unloading apparatus 30 when the object to be processed 40 is loaded. That is, the object to be processed 40 placed in the first position 11a is unloaded from the third position 11c, and the object to be processed 40 placed in the second position 11b is unloaded from the fourth position 11d.

The loading/unloading apparatus 30 carries in the object to be processed 40 through the loading gate 17a and places the object to be processed 40 over the top surface 11. The loading/unloading apparatus 30 carries out the object to be processed 40 through the unloading gate 17b. The loading/unloading apparatus 30 may take out an object to be processed 40 that has not been processed yet from a cassette 34. The loading/unloading apparatus 30 may store an object to be processed 40 that has already been processed into a cassette 34.

<Object to be Processed>

Next, the object to be processed 40 which undergoes laser processing performed by the laser processing apparatus 1 will be described. The object to be processed 40 includes, for example, a substrate and a semiconductor film formed over the substrate. The substrate is, for example, a rectangular plate-like member. The object to be processed 40 has a rectangular (or square) planar shape. Specifically, the substrate is a glass substrate and the semiconductor film is an amorphous silicon film. Laser light is applied to the amorphous silicon film, so that the amorphous film is crystallized. In this way, a polycrystalline silicon film is formed. Note that the object to be processed 40 is not limited to the substrate with an amorphous silicon film formed thereover, provided that the laser irradiation process is performed for it.

Figure 7:
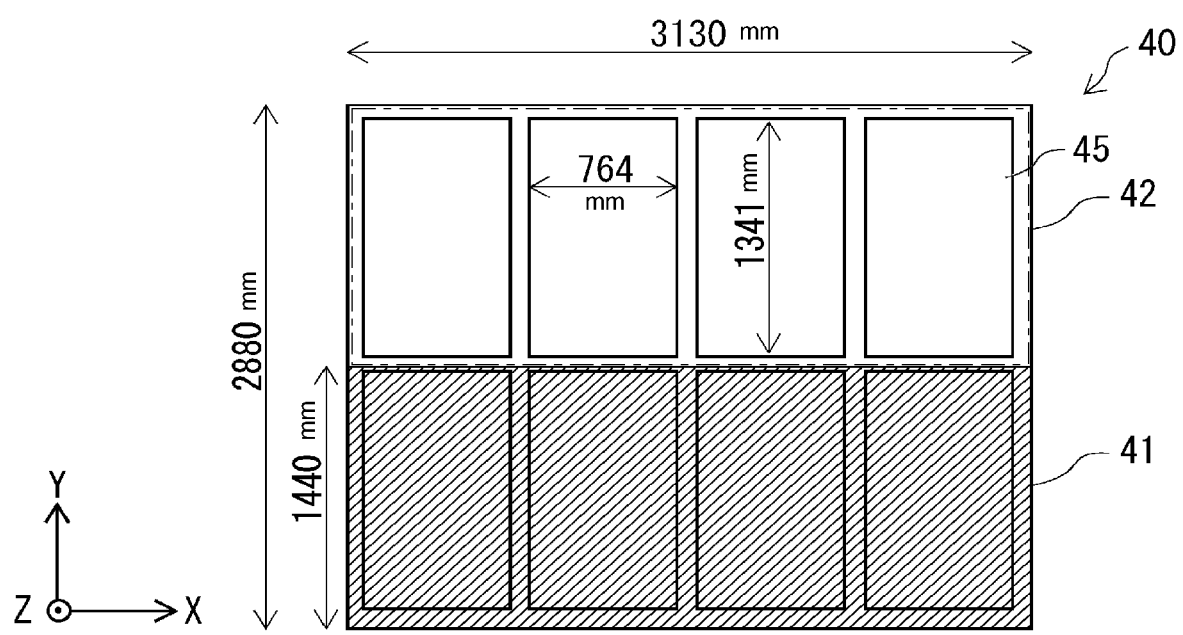
FIG. 7 is a plan view showing an example of an object to be processed in a laser processing apparatus according to an embodiment, and showing a case where a 60-inch panel is formed over a G10 substrate.
Figure 8:
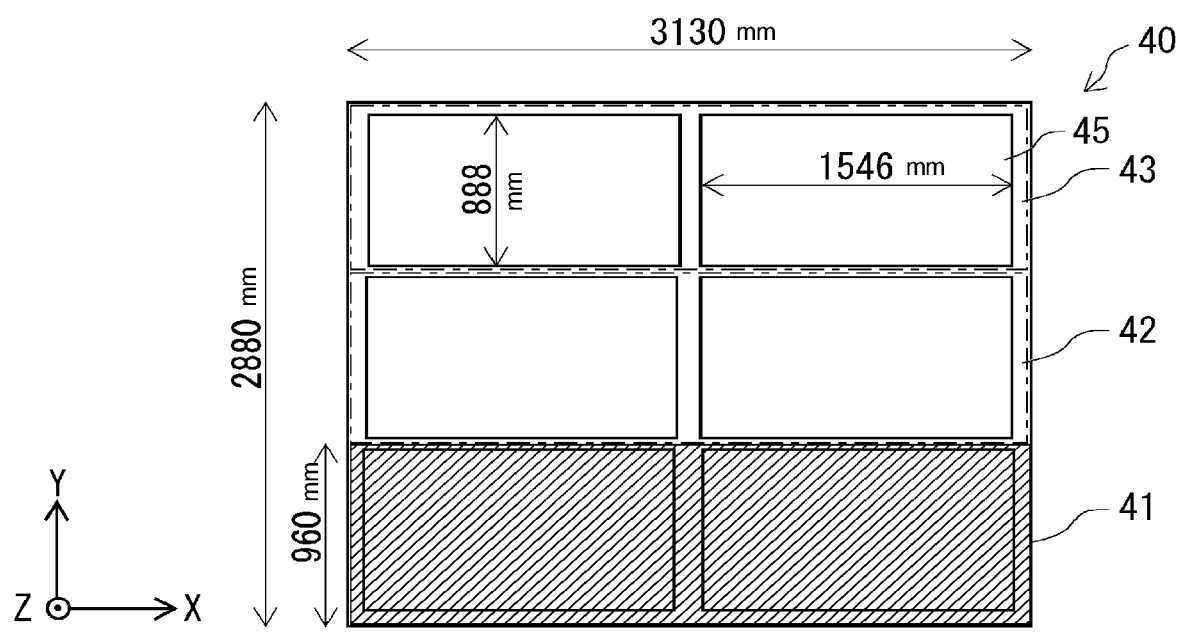
FIG. 8 is a plan view showing an example of an object to be processed in a laser processing apparatus according to an embodiment, and showing a case where a 70-inch panel is formed over a G10 substrate.
Figure 9:
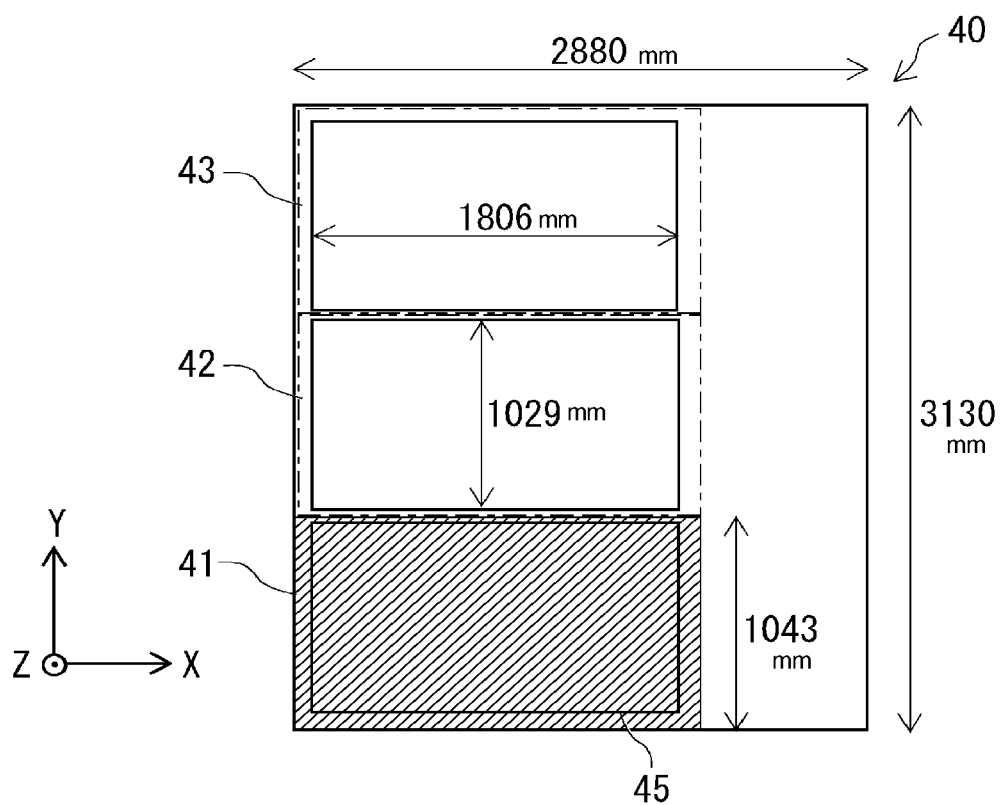
FIG. 9 is a plan view showing an example of an object to be processed in a laser processing apparatus according to an embodiment, and showing a case where an 80-inch panel is formed over a G10 substrate.
Figure 10:
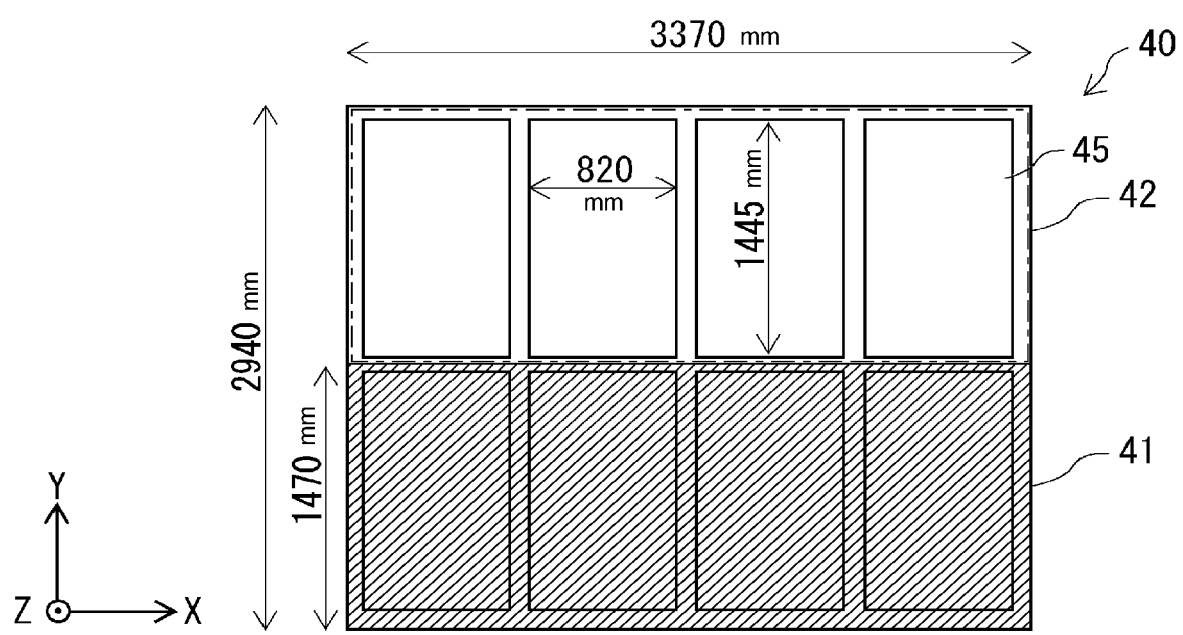
FIG. 10 is a plan view showing an example of an object to be processed in a laser processing apparatus according to an embodiment, and showing a case where a 65-inch panel is formed over a G10.5 substrate.
Figure 11:
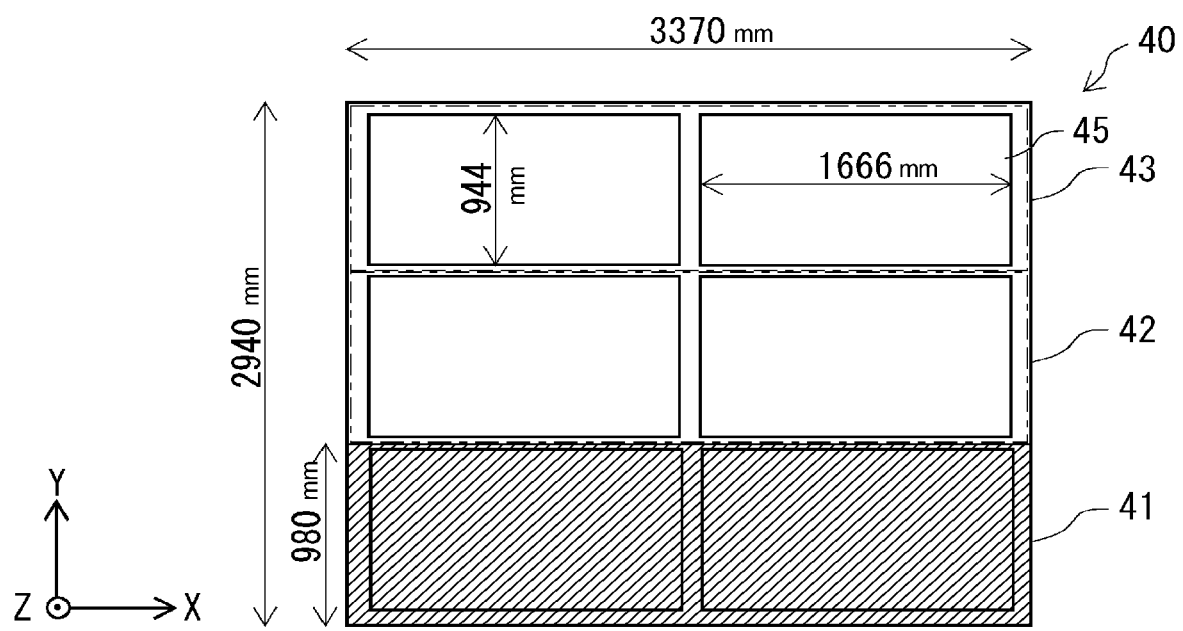
FIG. 11 is a plan view showing an example of an object to be processed in a laser processing apparatus according to an embodiment, and showing a case where a 75-inch panel is formed over a G10.5 substrate.
Figure 12:
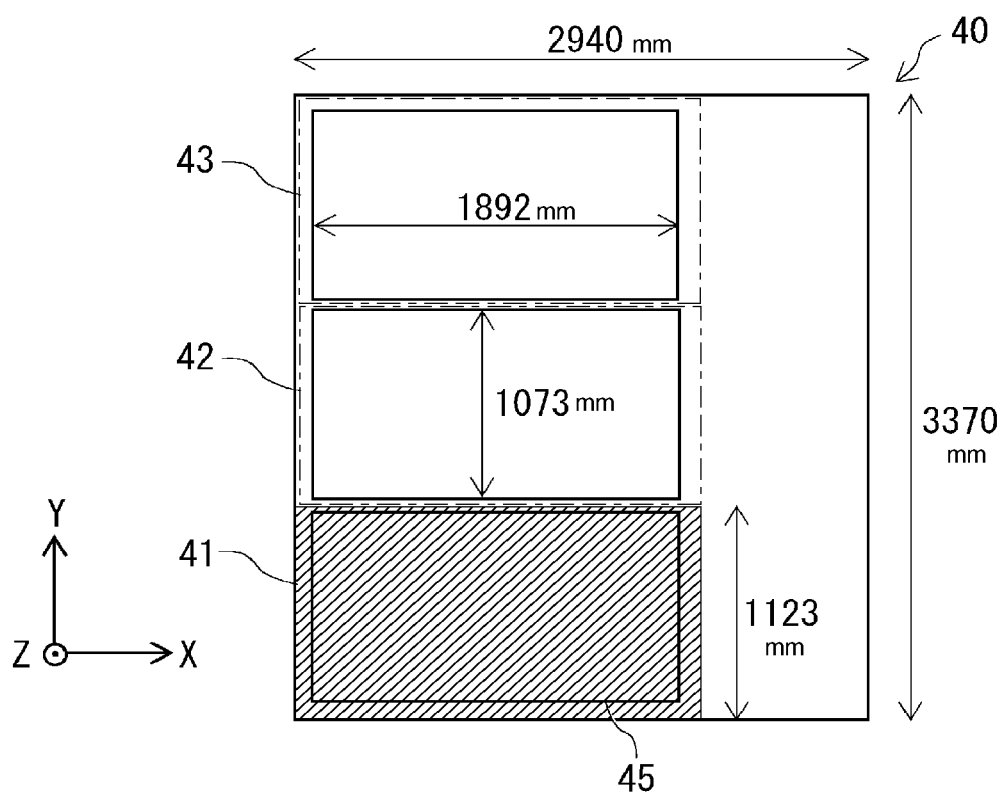
FIG. 12 is a plan view showing an example of an object to be processed in a laser processing apparatus according to an embodiment, and showing a case where an 85-inch panel is formed over a G10.5 substrate.

FIGS. 7 to 12 are plan views showing examples of the object to be processed 40 processed by the laser processing apparatus 1 according to an embodiment, and FIG. 7 shows a case where a 60-inch panel is formed in a G10 substrate. FIG. 8 shows a case where a 70-inch panel is formed in a G10 substrate. FIG. 9 shows a case where an 80-inch panel is formed in a G10 substrate. FIG. 10 shows a case where a 65-inch panel is formed in a G10.5 substrate. FIG. 11 shows a case where a 75-inch panel is formed in a G10.5 substrate. FIG. 12 shows a case where an 85-inch panel is formed in a G10.5 substrate.

As shown in FIGS. 7 to 9, when the object to be processed 40 includes a substrate, the lengths of the sides of the substrate are 3,130 [mm] and 2,880 [mm]. A glass substrate having such side lengths is referred to as a 10th-generation (G10) substrate. As shown in FIGS. 10 to 12, the lengths of the sides of the substrate may be 3,370 [mm] and 2,940 [mm]. A glass substrate having such side lengths is referred to as a 10.5th-generation (G10.5) substrate.

Further, although not shown in the drawings, the lengths of the sides of the substrate may be 2,500 [mm] and 2,200 [mm]. A glass substrate having such side lengths is referred to as an 8th-generation (G8) substrate. Further, the object to be processed 40 is preferably a glass substrate having an area of 2,160 [mm]×2,460 [mm] or larger. The thickness of the substrate is 0.5 to 0.63 [mm].

As described above, the length of the object to be processed 40, which is placed over the top surface 11 of the stage 10, in the Y-axis direction is 2,200 [mm] or longer. Therefore, the length of the object to be processed 40 in the Y-axis direction is longer than the length of the line beam 21 of the laser light. That is, the length of the irradiation area in the Y-axis direction on the object to be processed 40 placed over the top surface 11 of the stage 10 is longer than the length of the line beam 21. The irradiation area is an area that needs to be irradiated with laser light.

When the length of the irradiation area in the Y-axis direction is longer than the length of the line beam 21, the object to be processed 40 cannot be processed through one conveyance. Therefore, the object to be processed 40 is moved from the vicinity 12 of one end of the top surface 11 of the stage 10 to the vicinity 13 of the other end thereof a plurality of times.

As shown in FIG. 7, a substrate having a size of 3,130 [mm]×2,880 [mm] placed over the top surface 11 of the stage 10 includes eight (4×2) panels 45 each of which is the so-called 60-inch panel having a size of 764 [mm]×1,341 [mm]. Note that the length or the number in front of "×" indicates the length or the number in the X-axis direction, and the length or the number behind "×" indicates the length or the number in the Y-axis direction. The length of the line beam 21 of the laser light is set to 1,440 [mm]. In this case, the irradiation area on the object to be processed 40 includes a first irradiation part 41 and a second irradiation part 42. Each of the first and second irradiation parts 41 and 42 is a part that can be irradiated with laser light by one transfer of the object to be processed 40 in the X-axis direction. Each of the irradiation parts extends in the X-axis direction.

The first irradiation part 41 is, for example, a part located on the Y-axis direction negative side when the object to be processed 40 is divided into two equal parts in the Y-axis direction. The second irradiation part 42 is a part located on the Y-axis direction positive side when the object to be processed 40 is divided into two equal parts in the Y-axis direction.

When the first irradiation part 41 is irradiated with laser light, the object to be processed 40 is placed, for example, in the first position 11*a*. Then, the object to be processed 40 is conveyed along the X-axis direction. When the object to be processed 40 is moved over the top surface 11 of the stage 10, the first irradiation part 41 is irradiated with laser light. In this way, the first irradiation part 41 can be processed by the laser light.

Next, when the second irradiation part 42 is irradiated with laser light, the object to be processed 40 is placed in the second position 11*b*. Then, the object to be processed 40 is conveyed along the X-axis direction. When the object to be processed 40 is moved over the top surface 11 of the stage 10, the second irradiation part 42 is irradiated with laser light. In this way, the second irradiation part 42 can be processed by the laser light.

As described above, when the object to be processed 40 placed in the first position 11*a* is moved in the X-axis direction, the first irradiation part 41 is irradiated with laser light. When the object to be processed 40 placed in the second position 11*b* is moved in the X-axis direction, the second irradiation part 42 is irradiated with laser light.

As shown in FIG. 8, a substrate having a size of 3,130 [mm]×2,880 [mm] placed over the top surface 11 includes six (2×3) panels 45 each of which is the so-called 70-inch panel having a size of 1,546 [mm]×888 [mm]. The length of the line beam 21 of the laser light is set to 960 [mm]. In this case, the irradiation area on the object to be processed 40 includes a first irradiation part 41, a second irradiation part 42, and a third irradiation part 43. Each of the first, second and third irradiation parts 41, 42 and 43 is a part that can be irradiated with laser light by one transfer of the object to be processed 40 in the X-axis direction. Each of the irradiation parts extends in the X-axis direction. Note that FIG. 8 shows a state in which the object to be processed 40 is placed in the first position 11*a*.

The first irradiation part 41 is a part located on the Y-axis direction negative side when the object to be processed 40 is divided into three equal parts in the Y-axis direction. The second irradiation part 42 is a central part when the object to be processed 40 is divided into three equal parts in the Y-axis direction. The third irradiation part 43 is a part located on the Y-axis direction positive side when the object to be processed 40 is divided into three equal parts in the Y-axis direction. Therefore, in the object to be processed 40, the second irradiation part 42 is located between the first and third irradiation parts 41 and 43.

When the first irradiation part 41 is irradiated with laser light, the object to be processed 40 is placed in the first position 11*a*. Then, the object to be processed 40 is conveyed along the X-axis direction. When the object to be processed 40 is moved over the top surface 11 of the stage 10, the first irradiation part 41 is irradiated with laser light. In this way, the first irradiation part 41 can be processed by the laser light.

Next, when the second irradiation part 42 is irradiated with laser light, the object to be processed 40 is placed in the second position 11*b*. Then, the object to be processed 40 is conveyed along the X-axis direction. When the object to be processed 40 is moved over the top surface 11 of the stage 10, the second irradiation part 42 is irradiated with laser light. In this way, the second irradiation part 42 can be processed by the laser light.

Next, when the third irradiation part 43 is irradiated with laser light, the object to be processed 40 is first rotated by 180 [°] in a horizontal plane. For example, the object to be processed 40 is rotated by a rotating apparatus 32 provided outside the stage 10. Then, the object to be processed 40 is placed in the first position 11a. After that, the object to be processed 40 is conveyed along the X-axis direction. When the object to be processed 40 is moved over the top surface 11, the third irradiation part 43 is irradiated with laser light. In this way, the third irradiation part 43 can be irradiated with the laser light.

As described above, when the object to be processed 40 placed in the first position 11a is moved in the X-axis direction, the first irradiation part 41 or the third irradiation part 43 is irradiated with laser light. When the object to be processed 40 placed in the second position 11b is moved in the X-axis direction, the second irradiation part 42 is irradiated with laser light.

As shown in FIG. 9, a substrate having a size of 2,880 [mm]×3,130 [mm] placed over the top surface 11 includes three (1×3) panels 45 each of which is the so-called 80-inch panel having a size of 1,806 [mm]×1,029 [mm]. The length of the line beam 21 of the laser light is set to 1,043 [mm]. In this case, the irradiation area on the object to be processed 40 includes a first irradiation part 41, a second irradiation part 42, and a third irradiation part 43. Each of the first, second and third irradiation parts 41, 42 and 43 is a part that can be irradiated by one transfer of the object to be processed 40 in the X-axis direction. Each of the irradiation parts extends in the X-axis direction. Note that FIG. 9 shows a state in which the object to be processed 40 is placed in the first position 11a over the top surface 11 of the stage 10.

The first irradiation part 41 is a part located on the Y-axis direction negative side when the object to be processed 40 is divided into three equal parts in the Y-axis direction. The second irradiation part 42 is a central part when the object to be processed 40 is divided into three equal parts in the Y-axis direction. The third irradiation part 43 is a part located on the Y-axis direction positive side when the object to be processed 40 is divided into three equal parts in the Y-axis direction. Therefore, in the object to be processed 40, the second irradiation part 42 is located between the first and third irradiation parts 41 and 43.

Even in the case of FIG. 9, when the object to be processed 40 placed in the first position 11a is moved in the X-axis direction, the first irradiation part 41 or the third irradiation part 43 is irradiated with laser light. When the object to be processed 40 placed in the second position 11b is moved in the X-axis direction, the second irradiation part 42 is irradiated with laser light.

As shown in FIG. 10, a substrate having a size of 3,370 [mm]×2,940 [mm] placed over the top surface 11 of the stage 10 includes eight (4×2) panels 45 each of which is the so-called 65-inch panel having a size of 820 [mm]×1,445 [mm]. The length of the line beam 21 of the laser light is set to 1,470 [mm]. In this case, the irradiation area on the object to be processed 40 includes a first irradiation part 41 and a second irradiation part 42. The relation between the first and second irradiation parts 41 and 42, and the relation between the first and second positions 11a and 11b are similar to those of the substrate shown in FIG. 7.

As shown in FIG. 11, a substrate having a size of 3,370 [mm]×2,940 [mm] placed over the top surface 11 of the stage 10 includes six (2×3) panels 45 each of which is the so-called 75-inch panel having a size of 1,666 [mm]×944 [mm]. The length of the line beam 21 of the laser light is set to 980 [mm]. In this case, the irradiation area on the object to be processed 40 includes a first irradiation part 41, a second irradiation part 42, and a third irradiation part 43. The relation among the first, second and third irradiation parts 41, 42 and 43, and the relation between the first and second positions 11a and 11b are similar to those of the substrate shown in FIG. 8.

As shown in FIG. 12, a substrate having a size of 2,940 [mm]×3,370 [mm] placed over the top surface 11 of the stage 10 includes three (1×3) panels 45 each of which is the so-called 85-inch panel having a size of 1,892 [mm]×1,073 [mm]. The length of the line beam 21 of the laser light is set to 1,123 [mm]. In this case, the irradiation area on the object to be processed 40 includes a first irradiation part 41, a second irradiation part 42, and a third irradiation part 43. The relation among the first, second and third irradiation parts 41, 42 and 43, and the relation between the first and second positions 11a and 11b are similar to those of the substrate shown in FIG. 9.

Note that cases in which the irradiation area on the object to be processed 40 includes two or three irradiation parts have been described. However, the irradiation area on the object to be processed 40 may include four or more irradiation parts.

<Laser Processing Method>

Figure 13:
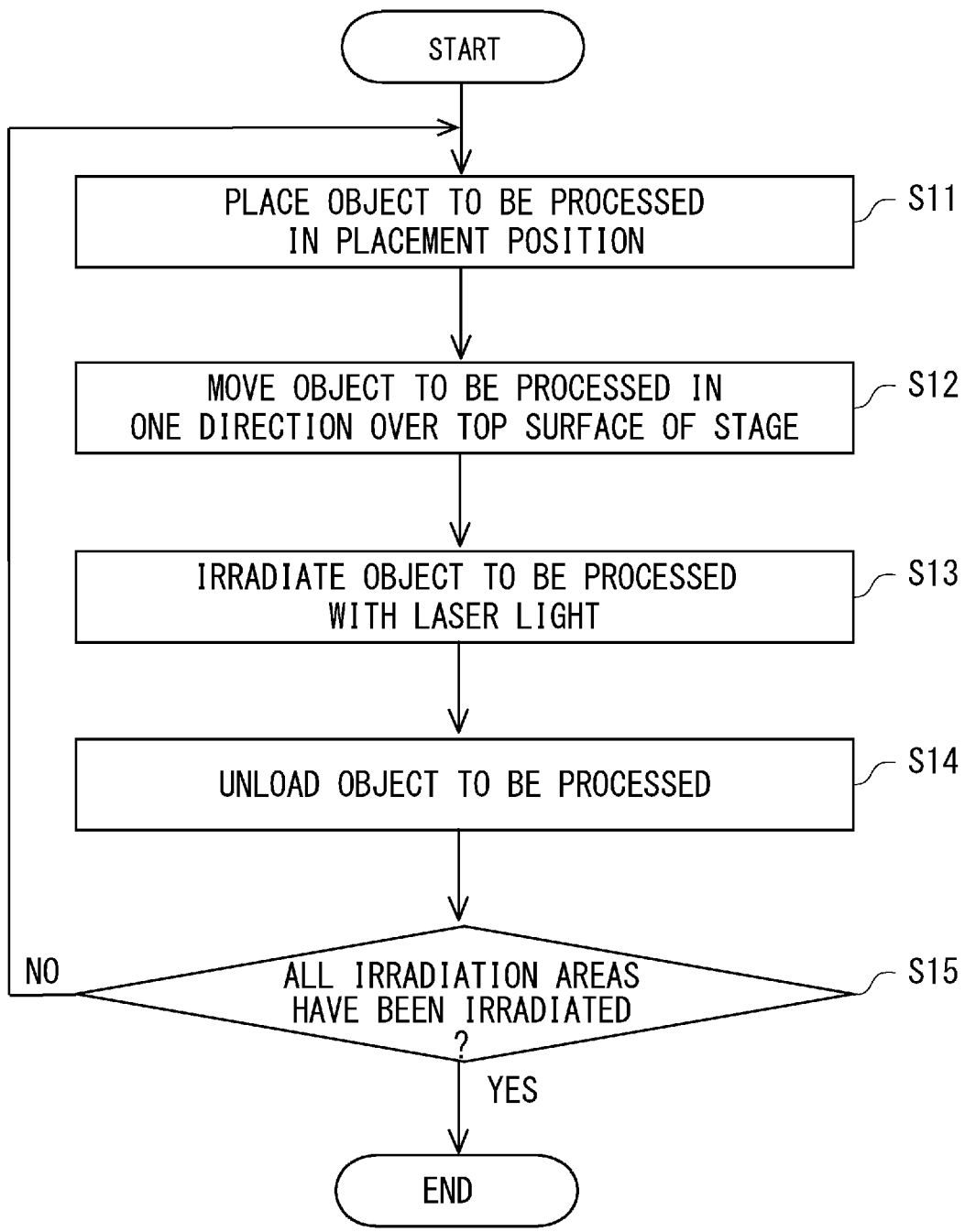
FIG. 13 is a flowchart showing an example of a laser irradiation method using a laser processing apparatus according to an embodiment.

Next, a laser irradiation method will be described for explaining operations performed by the laser processing apparatus 1. FIG. 13 is a flowchart showing an example of a laser irradiation method using a laser processing apparatus according to an embodiment. As shown in a step S11 in FIG. 13, firstly, an object to be processed 40 is loaded onto the stage 10 and placed in the placement position. The placement position of the object to be processed 40 is selected by the control unit 50 or the loading/unloading control unit 31.

Figure 14:
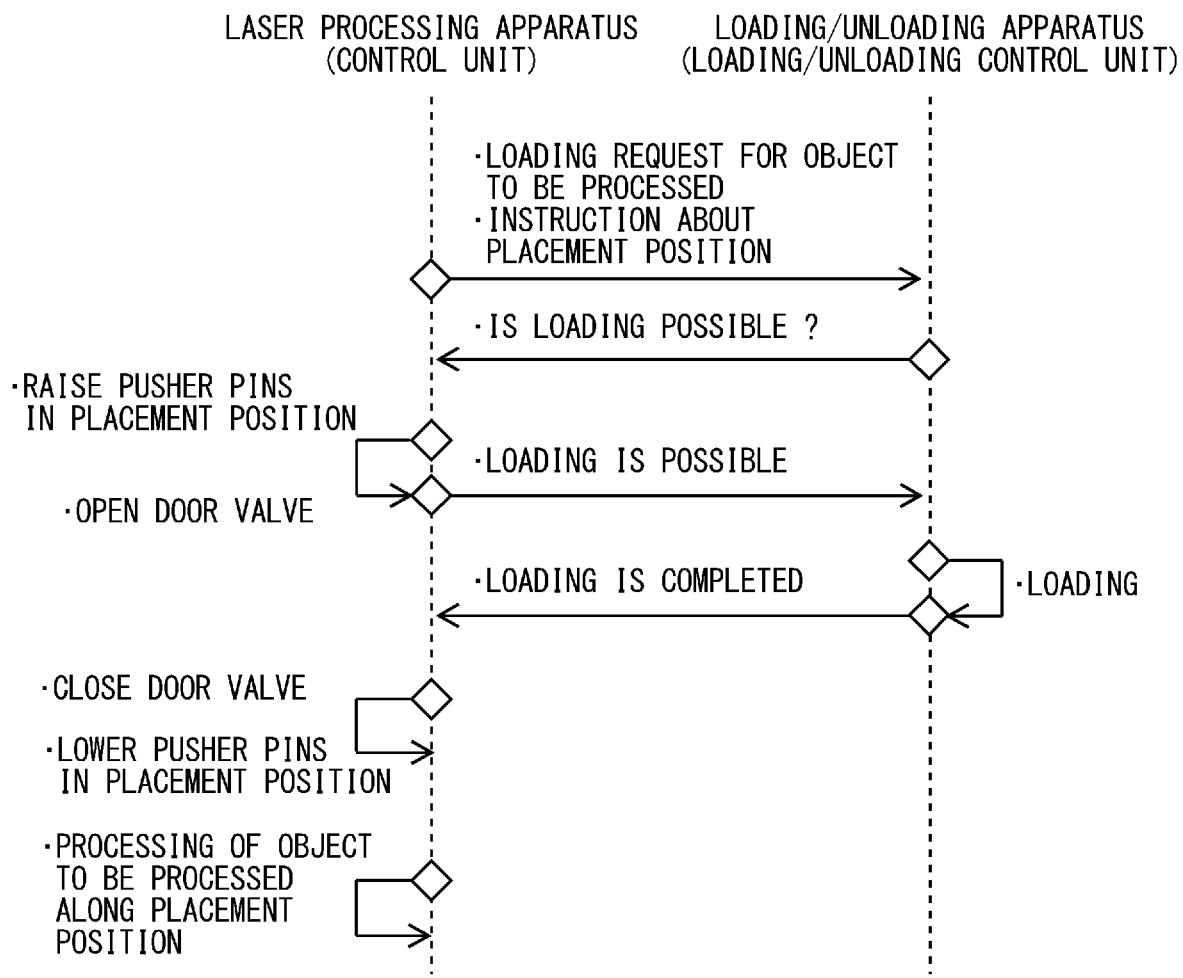
FIG. 14 shows an example of an operation performed by a control unit of a laser processing apparatus and a loading/unloading apparatus according to an embodiment.

FIG. 14 shows an example of operations performed by the laser processing apparatus 1 and the loading/unloading apparatus 30 according to an embodiment, and shows a case where the control unit 50 of the laser processing apparatus 1 selects the placement position of the object to be processed 40 and instructs the loading/unloading apparatus 30 about the selected placement position.

As shown in FIG. 14, the control unit 50 requests the loading/unloading apparatus 30 to load the object to be processed 40. When doing so, the control unit 50 selects the first position 11a or the second position 11b as the placement position of the object to be processed 40. For example, the control unit 50 first selects the first position 11a as the placement position. Then, the control unit 50 instructs the loading/unloading apparatus 30 to place the object to be processed 40 in the selected first position 11a. As described above, the control unit 50 transmits a first position control signal for controlling the placement position of the object to be processed 40 over the stage 10 to the loading/unloading apparatus 30 for the object to be processed 40 (step a).

The loading/unloading apparatus 30 inquires of the control unit 50 as to whether the object to be processed 40 can be loaded. In response to this inquiry, the motion controller 15 of the laser processing apparatus 1 raises the pusher pins 14 located in the first position 11a which has been selected as the placement position. Further, the control unit 50 opens the door valve 23 of the loading gate 17a. Then, the control unit 50 notifies the loading/unloading apparatus 30 that the object to be processed 40 can be loaded.

In response to this notification, the loading/unloading apparatus 30 places the object to be processed 40 in the first position 11a over the top surface 11 of the stage 10 through the loading gate 17a. That is, the object to be processed 40 is placed, by the loading/unloading apparatus 30, in the first position over the stage 10 determined by the first position control signal (step b).

The loading/unloading apparatus 30 notifies the control unit 50 that the loading of the object to be processed 40 has been completed. The control unit 50 closes the door valve 23 of the loading gate 17a. The motion controller 15 lowers the pusher pins 14 located in the first position 11a. Then, the process proceeds to the next process, i.e., proceeds to the processing for the object to be processed 40 along the placement position.

As described above, firstly, the object to be processed 40 is placed in the first position 11a in the vicinity 12 of one end of the stage 10. In the laser processing method according to this embodiment, the control unit 50 of the laser processing apparatus 1 is used. Then, firstly, the control unit 50 is made to select the first position 11a as the placement position of the object to be processed 40. The control unit 50 is made to instruct the loading/unloading apparatus 30 about the selected placement position. Further, the control unit 50 is made to instruct the loading/unloading apparatus 30 to place the object to be processed 40 in the first position 11a.

Figure 15:
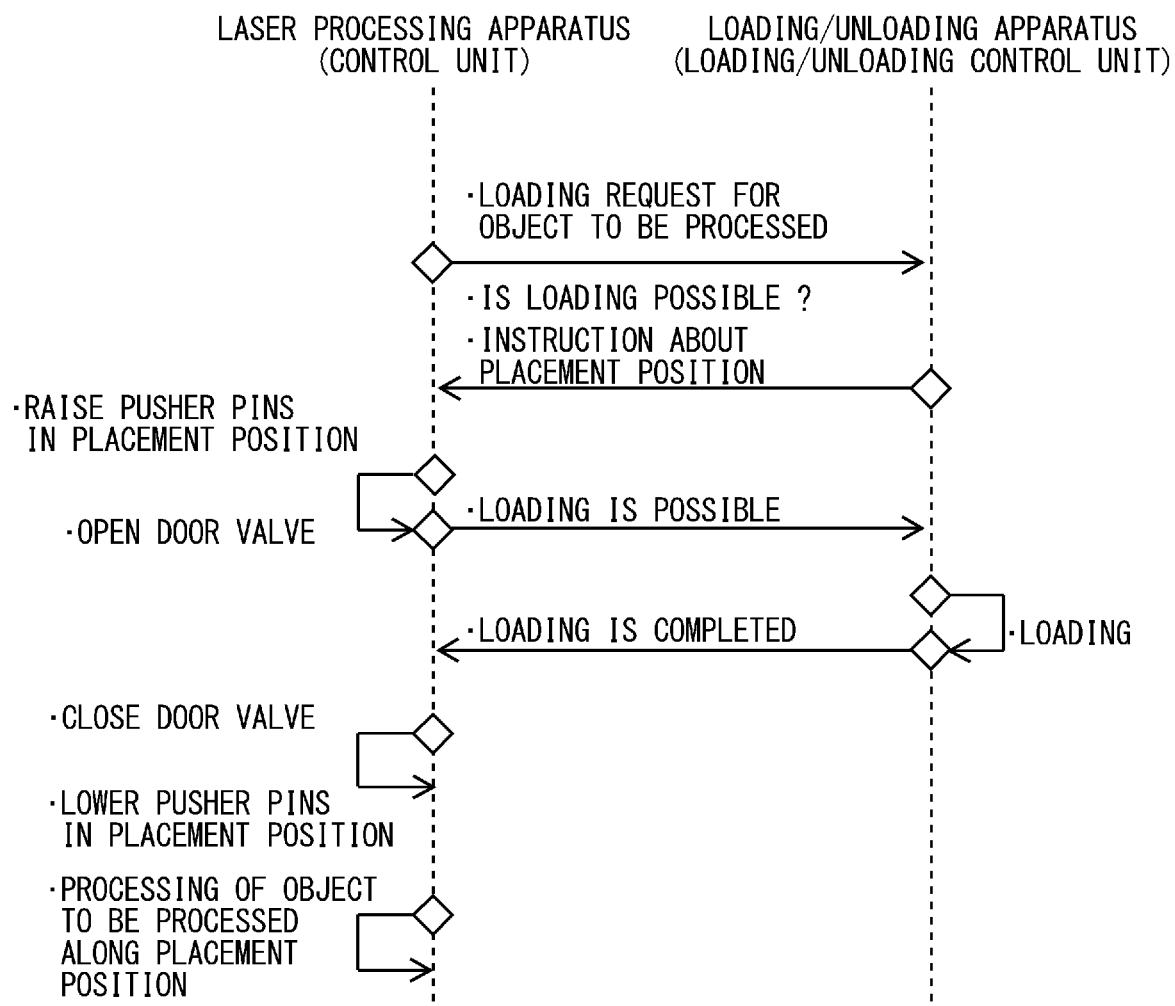
FIG. 15 shows an example of an operation performed by a control unit of a laser processing apparatus and a loading/unloading apparatus according to an embodiment.

FIG. 15 shows an example of operations performed by the laser processing apparatus 1 and the loading/unloading apparatus 30 according to an embodiment, and shows a case where the loading/unloading control unit 31 of the loading/unloading apparatus 30 selects the placement position of the object to be processed 40 and instructs the laser processing apparatus 1 about the selected placement position.

As shown in FIG. 15, the control unit 50 of the laser processing apparatus 1 requests the loading/unloading apparatus 30 to load the object to be processed 40. The loading/unloading control unit 31 of the loading/unloading apparatus 30 inquires of the laser processing apparatus 1 as to whether the object to be processed 40 can be loaded. Further, the loading/unloading control unit 31 selects the first position 11a or the second position 11b as the placement position of the object to be processed 40. For example, the loading/unloading control unit 31 first selects the first position 11a as the placement position. Then, the loading/unloading control unit 31 instructs the laser processing apparatus 1 so that the object to be processed 40 can be placed in the selected first position 11a. As described above, the loading/unloading control unit 31 of the loading/unloading apparatus 30 may select the placement position and instruct the laser processing apparatus 1 about the selected placement position.

In response to this instruction, the motion controller 15 of the laser processing apparatus 1 raises the pusher pins 14 located in the placement position. Further, the motion controller 15 opens the door valve 23 of the loading gate 17a. Then, the laser processing apparatus 1 notifies the loading/unloading control unit 31 of the loading/unloading apparatus 30 that the object to be processed 40 can be loaded.

The loading/unloading apparatus 30 places the object to be processed 40 in the placement position over the top surface 11 through the loading gate 17a. The loading/unloading apparatus 30 notifies the laser processing apparatus 1 that the loading of the object to be processed 40 has been completed. The laser processing apparatus 1 closes the door valve 23 of the loading gate 17a. The motion controller 15 lowers the pusher pins 14 located in the placement position. Then, the process proceeds to the next process, i.e., proceeds to the processing for the object to be processed 40 along the placement position.

Next, as shown in a step S12 in FIG. 13, the object to be processed 40 is moved in the X-axis direction over the top surface 11 of the stage 10. Then, the object to be processed 40 is conveyed to the laser light irradiation position over the stage 10 (step c). For example, the object to be processed 40 placed in the first position 11a is moved from the vicinity 12 of one end of the top surface 11 to the vicinity 13 of the other end thereof along the X-axis direction. In this process, the object to be processed 40 is moved only in the first direction. The motion controller 15 controls the grasping part 16 and thereby makes the grasping part 16 grasp the object to be processed 40 and move it in the X-axis direction. When doing so, the object to be processed 40 may be levitated from the top surface 11 by the levitating unit controller 24.

Next, as shown in a step S13 in FIG. 13, the object to be processed 40 is irradiated with laser light. Specifically, the control unit 50 applies laser light to the object to be processed 40, which is moving over the top surface 11 of the stage 10, by controlling the laser irradiation unit controller 22 (step d).

Next, as shown in a step S14 in FIG. 13, the object to be processed 40 is unloaded by the loading/unloading apparatus 30 (step e). Specifically, the control unit 50 unloads the object to be processed 40 from the vicinity 13 of the other end of the top surface 11 of the stage 10 by controlling the loading/unloading apparatus 30.

Next, as shown in a step S15 in FIG. 13, the control unit 50 determines whether or not all the irradiation areas have been irradiated with laser light. Whether all the irradiation areas have been irradiated with laser light means, in the case where the irradiation areas include the first, second and third irradiation parts 41, 42 and 43, whether all of the first to third irradiation parts are irradiated with laser light. When all the irradiation areas have not been irradiated with laser light (in the case of No), for example, when the first irradiation part 41 has already been irradiated with laser light but the second irradiation part 42 has not irradiated with laser light yet, the process returns to the step S11, in which the object to be processed 40 is loaded onto the stage 10 and is placed in the second position 11b. If necessary, the object to be processed 40 is rotated by the rotating apparatus 32 and then placed over the stage 10.

The placement position of the object to be processed 40 is selected, for example, by the control unit 50. The control unit 50 selects the second position 11b as the placement position of the object to be processed 40. The control unit 50 instructs the loading/unloading apparatus 30 about the selected placement position. That is, the control unit 50 transmits a second position control signal to the loading/unloading apparatus 30 (step f). Further, the control unit 50 instructs the loading/unloading apparatus 30 to place the object to be processed 40 in the second position 11b. In response to this instruction, the object to be processed 40 is placed in the second position different from the first position over the stage 10, which is determined by the second position control signal, by the loading/unloading apparatus 30 (step g).

Then, a step S12 (step h), a step S13 (step i), and a step S14 (step j) are successively performed. Note that the direction connecting the first position and the second position intersects the direction in which the object to be processed 40 is conveyed in the steps (c) and (h). Note that similarly to the step (c), the object to be processed 40 moves only in the first direction in the step (h).

On the other hand, when it is determined that all the irradiation areas have been irradiated in the step S15 (in the case of Yes), the laser irradiation process is finished. In this way, the laser processing can be performed for the object to be processed 40.

Next, effects of this embodiment will be described.

In the laser processing apparatus 1 according to this embodiment, even when the length of the object to be processed 40 is longer than that of the line beam 21 of the laser light, the object to be processed 40 is moved from the vicinity 12 of one end of the top surface 11 of the stage 10 to the vicinity 13 of the other end thereof only in one direction. Therefore, it is possible to prevent the area of the stage 10 from being increased.

The loading/unloading apparatus 30 places the object to be processed 40 in the first position 11a or the second position 11b in the vicinity 12 of one end. Therefore, the laser processing apparatus 1 does not require a moving mechanism for widely moving the object to be processed 40 in the Y-axis direction. As a result, it is possible to simplify the mechanism of the laser processing apparatus 1 and thereby prevent the size of the laser processing apparatus 1 from being increased. However, the laser processing apparatus 1 may be equipped with a mechanism for finely moving the object to be processed 40 in the Y-axis direction without making the mechanism of the laser processing apparatus 1 considerably complicated.

Figure 16:
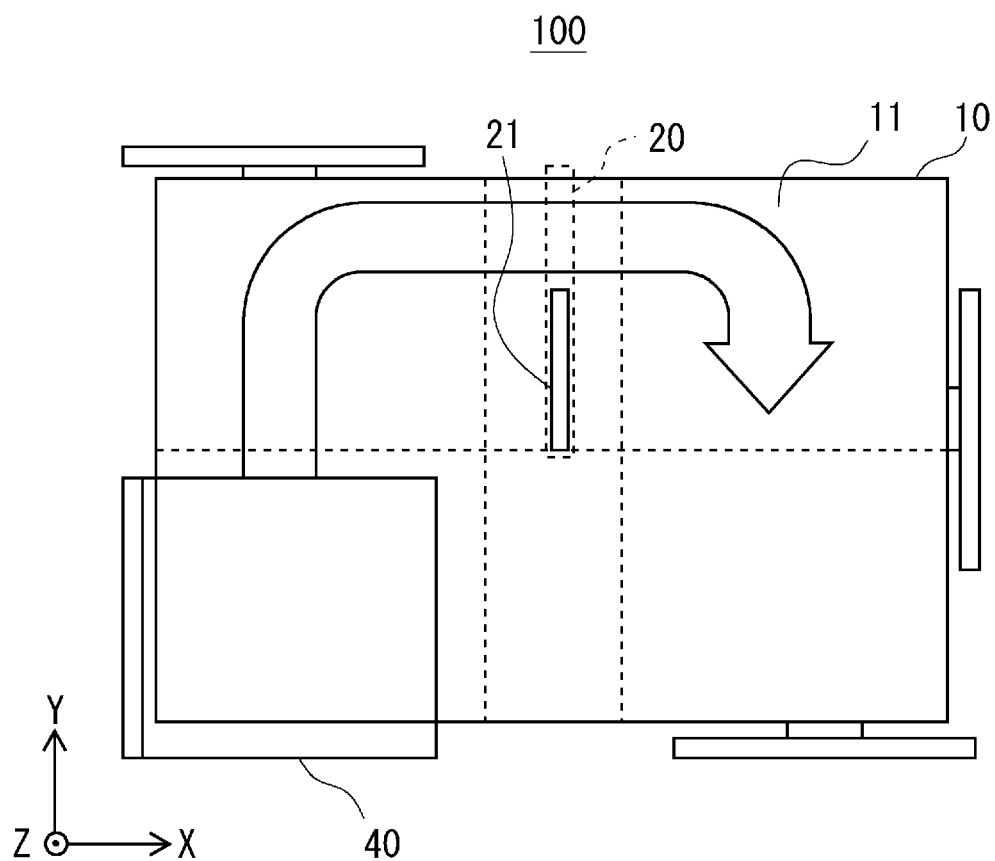
FIG. 16 is a plan view showing an example of a laser processing apparatus according to a comparative example.

FIG. 16 is a plan view showing an example of a laser processing apparatus according to a comparative example. As shown in FIG. 16, a laser processing apparatus 100 according to the comparative example moves an object to be processed 40 in the X-axis direction and in the Y-axis direction over a top surface 11 of a stage 10 when the length of the object to be processed 40 is longer than that of a line beam 21 of laser light. Therefore, the area of the stage 10 is increased.

Further, the laser processing apparatus 100 according to the comparative example needs to have a moving mechanism for moving the object to be processed 40 in the Y-axis direction and a rotating mechanism for rotating the object to be processed 40 in a horizontal plane. Therefore, the mechanism of the laser processing apparatus 100 becomes complicated and its size is increased.

Further, in the laser processing apparatus 100 according to the comparative example, until the laser processing for one object to be processed 40 is completed, the next object to be processed 40 cannot be placed over the stage 10. Therefore, it is impossible to improve the cycle time and hence impossible to improve the throughput. Further, wasteful shots in which emitted laser light is not used for the actual processing increase and hence the production cost increases. If the emission of the laser light is stopped in order to reduce the wasteful shots, the stability of the laser light deteriorates.

In contrast to this, in the laser processing apparatus 1 according to this embodiment, it is possible to successively convey a plurality of objects to be processed 40 in the X-axis direction over the stage 10. Therefore, it is possible to improve the cycle time and hence to improve the throughput. Further, since a plurality of objects 40 to be processed can be conveyed in the X-axis direction without interruption, wasteful shots can be reduced and hence the production cost can be reduced. Further, since it is possible to keep the laser light emitting state, the stability of the laser light is improved.

In the laser processing apparatus 1 according to this embodiment, a part of the first position 11a overlaps a part of the second position 11b over the top surface 11. Therefore, it is possible to prevent the area of the stage 10 from being increased. In the case of using a levitating unit for levitating an object to be processed 40, it is possible to reduce the consumption of gas ejected from the top surface 11 of the stage 10. Note that an inert gas such as air or nitrogen is used as the gas ejected from the top surface 11.

Since it is possible to increase the length of a substrate placed over the top surface 11 of the stage 10 to 2,880 [mm] or longer, the laser processing apparatus 1 can be used for glass substrates for next-generation panels. Even when a substrate whose length is three times or longer of the length of the line beam 21 of laser light is irradiated with the laser light, it is possible to place, among the first to third irradiation parts, the first and third irradiation parts 41 and 43 in the first position 11a and thereby to irradiate them with the laser light. Therefore, it is possible to make the length of the top surface 11 of the stage 10 in the Y-axis direction shorter than twice the length of the object to be processed 40 in the Y-axis direction.

Modified Example 1

Next, a modified example 1 of the above-described embodiment will be described. In this modified example, bars are provided in place of the pusher pins 14 as the holding means for the object to be processed 40.

Figure 17:
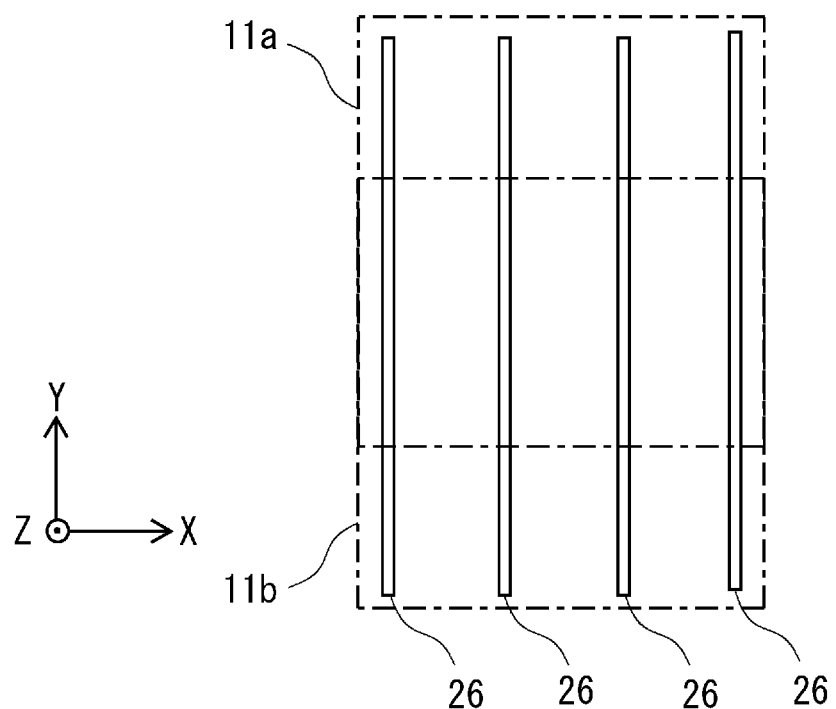
FIG. 17 is a plan view showing an example of holding means according to a first modified example of an embodiment.

FIG. 17 is a plan view showing an example of holding means according to the modified example 1 of the embodiment. As shown in FIG. 17, in this modified example, bars 26 are provided in the top surface 11 of the stage 10. The bars 26 extend in the Y-axis direction. A plurality of bars 26 may be provided separately in each of the first and second positions 11a and 11b. Alternatively, bars 26 may be provided so as to extend from the first position 11a to the second position 11b.

The bars 26 are controlled by the motion controller 15 through a driver(s). The bars 26 are raised from the top surface 11 of the stage 10 when an object to be processed 40 is held by them. The bars 26 are accommodated in the stage 10 when the object to be processed 40 is moved in the X-axis direction. The bars 26 may be accommodated in the stage 10 in such a manner that the closer they are located to the grasping part 16, the earlier they are accommodated in the stage 10, so that the grasping part 16 can grasp the object to be processed 40. Specifically, the bars 26 may be curved so that the closer they are located to the grasping part 16, the earlier they are accommodated in the stage 10.

According to the laser processing apparatus 1 in accordance with the modified example 1, the object to be processed 40 can be held in a stabled manner. Further, the holding mechanism can be simplified. The rests of the configuration and the effects are the same as those in the description of the embodiment.

Modified Example 2

Next, a modified example 2 of the above-described embodiment will be described. In this modified example, each of the loading holding part and the unloading holding part for the object to be processed 40 is formed by a plurality of grooves. Grooves extending in the Y-axis direction are formed in the vicinity 12 of one end and the vicinity 13 of the other end of the top surface 11 of the stage 10.

Figure 18:
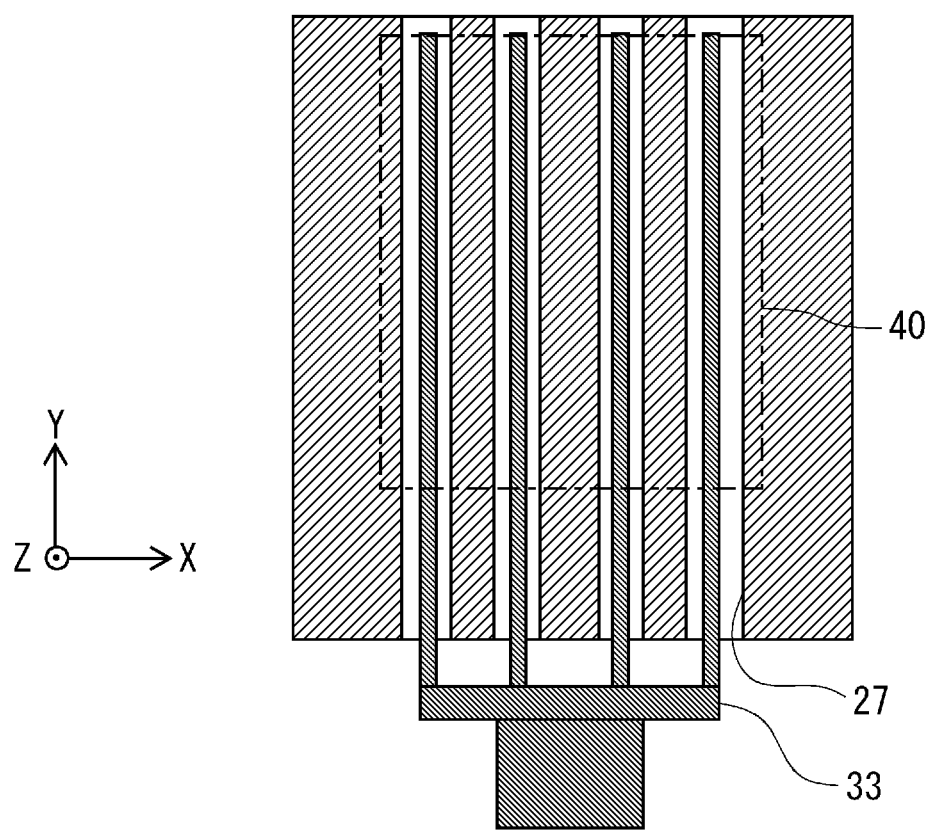
FIG. 18 is a plan view showing an example of a stage according to a second modified example of an embodiment.
Figure 19:
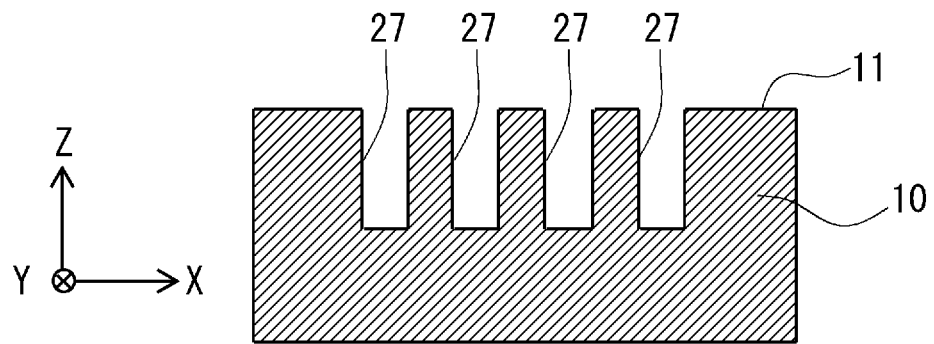
FIG. 19 is a cross-sectional view showing an example of a stage according to the second modified example of the embodiment.

FIG. 18 is a plan view showing an example of a stage 10 according to the modified example 2 of the embodiment. FIG. 19 is a cross-sectional view showing the example of the stage 10 according to the modified example 2 of the embodiment. As shown in FIGS. 18 and 19, grooves 27 extending in the Y-axis direction are formed in the top surface of the stage 10. The grooves 27 are disposed in the vicinity 12 of one end and the vicinity 13 of the other end of the top surface 11 of the stage 10. The loading/unloading apparatus 30 includes an arm part 33. The loading/unloading apparatus 30 inserts the arm part 33 into the plurality of grooves 27 and thereby loads/unloads the object to be processed 40. Specifically, the arm part 33 of the loading/unloading apparatus 30 for holding the object to be processed 40 is inserted into the grooves 27. The tip of the arm part 33 is divided into, at the maximum, the same number of branches as the number of the grooves 27. The branched parts of the arm part 33 extend in the Y-axis direction.

The loading/unloading apparatus 30 holds the object to be processed 40 over the arm part 33. Then, when the object to be processed 40 is placed over the top surface 11 of the stage 10, the branched parts of the arm part 33 are inserted into the grooves 27. After the object to be processed 40 is placed over the top surface 11, the loading/unloading apparatus 30 pulls out the arm part 33 from the grooves 27. Further, when the object to be processed 40 is unloaded from the stage 10, the branched parts of the arm part 33 are inserted into the grooves 27 below the top surface 11 over which the object to be processed 40 is placed. Then, the object to be processed 40, which is placed over the stage 10, is scooped by and put over the arm part 33. The arm part 33 is pulled out from the grooves 27 while the object to be processed 40 are left placed over the arm part 33. In this way, the object to be processed 40 is loaded and unloaded.

According to the laser processing apparatus 1 in accordance with the modified example 2, it is possible to reduce the control of the holding mechanism performed by the motion controller 15 and thereby further simplify the mechanism of the laser processing apparatus 1. The rests of the configuration and the effects are the same as those in the descriptions of the embodiment and the modified example 1.

<Method for Manufacturing Semiconductor Device>

Next, as another embodiment, a method for manufacturing a semiconductor device by using the above-described laser processing apparatus 1 will be described. In this embodiment, a laser annealing apparatus is used as the laser processing apparatus 1. The method for manufacturing a semiconductor device according to this embodiment includes the steps of: preparing an object to be processed 40 including a substrate and an amorphous film formed over the substrate; and crystallizing the amorphous film by irradiating the amorphous film with laser light. A substrate in which an amorphous semiconductor film is formed is used as the object to be processed 40. For example, a glass substrate over which amorphous silicon is formed is used. In the step of crystallizing the amorphous film, a laser processing method using the laser processing apparatus 1 is carried out.

The semiconductor device is a semiconductor device including TFTs (Thin Film Transistors). In this case, it is possible to form a polysilicon film by applying laser light to an amorphous silicon film and thereby crystallizing the amorphous silicon film.

Figure 20:
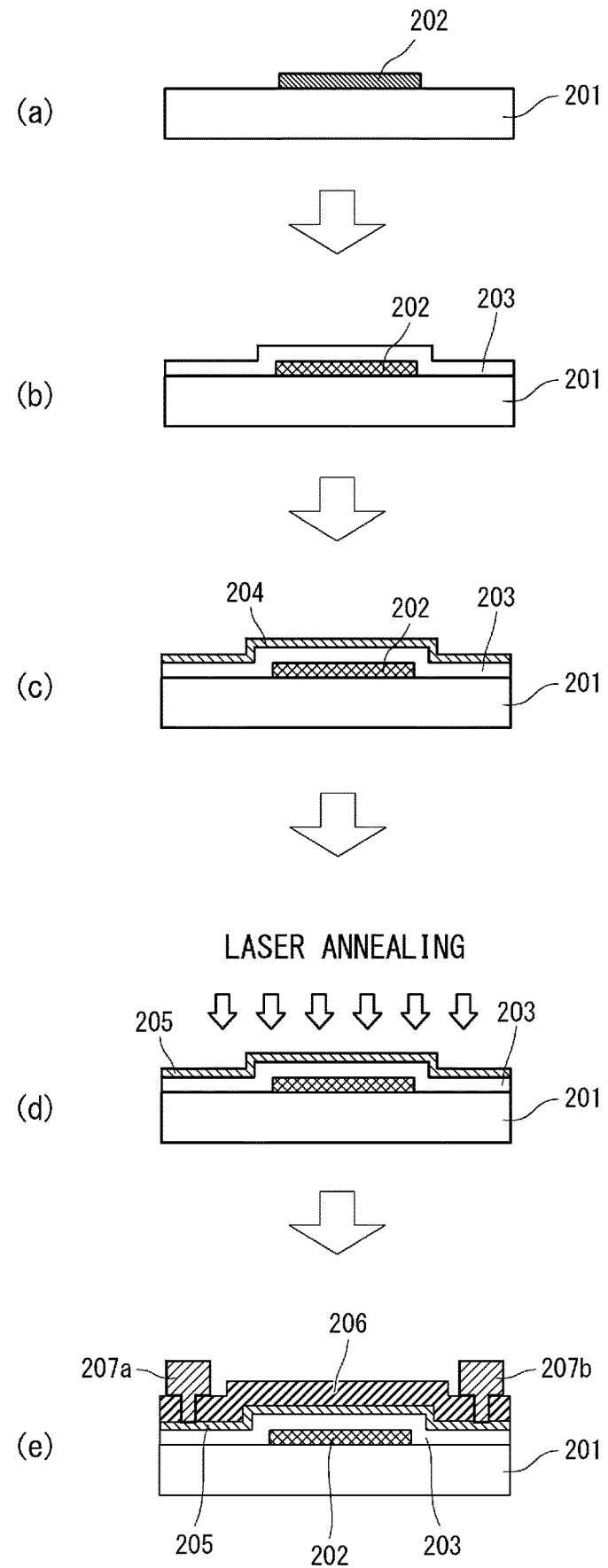
FIG. 20 is a cross-sectional view showing an example a method for manufacturing a semiconductor device.

FIG. 20 is a cross-sectional view for explaining an example of a method for manufacturing a semiconductor device. The laser processing apparatus 1 according to the above-described embodiment is suitable for manufacturing a TFT array substrate. A method for manufacturing a semiconductor device including a TFT is described hereinafter.

Firstly, as shown in FIG. 20(a), a gate electrode 202 is formed over a glass substrate 201. For example, a metal thin film containing aluminum or the like can be used for the gate electrode 202. Next, as shown in FIG. 20(b), a gate insulating film 203 is formed over the gate electrode 202. The gate insulating film 203 is formed so as to cover the gate electrode 202. After that, as shown in FIG. 20(c), an amorphous silicon film 204 is formed over the gate insulating film 203. The amorphous silicon film 204 is disposed so as to be placed over the gate electrode 202 with the gate insulating film 203 interposed therebetween. As described above, firstly, a substrate in which an amorphous semiconductor film is formed is prepared (step A)

The gate insulating film 203 is, for example, a silicon nitride film ($SiN_x$), a silicon oxide film ($SiO_2$ film), or a laminated film thereof. Specifically, the gate insulating film 203 and the amorphous silicon film 204 are successively formed by a CVD (Chemical Vapor Deposition) method. The glass substrate 201 with the amorphous silicon film 204 deposited thereon is the object 40 to be processed in the laser processing apparatus 1.

Then, as shown in FIG. 20(d), a polysilicon film 205 is formed by applying laser light to the amorphous silicon film 204 by using the above-described laser processing apparatus 1 and thereby crystallizing the amorphous silicon film 204. For example, as explained for the above-described laser irradiation method, a first position control signal for controlling the placement position of the substrate over the stage 10 is transmitted to the substrate loading/unloading apparatus 30 for the substrate (step B). Then, the substrate is placed in a first position over the stage 10 determined by the position control signal by the loading/unloading apparatus 30 (step C). After that, the substrate is conveyed over the stage 10 (step D), and the substrate is irradiated with laser light, so that the amorphous semiconductor film is converted into a polycrystalline state (step D). After the amorphous semiconductor film is converted into the polycrystalline state, the substrate is unloaded by the loading/unloading apparatus 30 (step F).

When not all the irradiation areas have not been irradiated with laser light, a second position control signal is transmitted to the loading/unloading apparatus 30 (step G), so that the substrate is placed in a second position different from the first position over the stage 10 determined by the second position control signal by the loading/unloading apparatus 30 (step H). Then, the substrate is conveyed to the laser light irradiation position over the stage 10 (step I) and the substrate is irradiated with laser light (step J). In this way, a polysilicon film 205 in which silicon is crystallized is formed over the gate insulating film 203.

Note that it is possible to, when laser is applied to the glass substrate 201, reduce the effect of warping thereof by using the laser processing apparatus 1 according to the above-described embodiment. Therefore, it is possible to prevent the amorphous silicon film 204 from being displaced from the depth of field (DOF) of the laser light applied thereto. Therefore, it is possible to form a uniformly-crystallized polysilicon film 205.

After all the irradiation areas are irradiated with laser light and the semiconductor film is thereby converted into a polycrystalline state, the substrate is unloaded by the loading/unloading apparatus 30 (step K).

After that, as shown in FIG. 20(e), an inter-layer insulating film 206, a source electrode 207a, and a drain electrode 207b are formed over the polysilicon film 205. The inter-layer insulating film 206, the source electrode 207a, and the drain electrode 207b can be formed by an ordinary photolithography method or an ordinary film forming method.

It is possible to manufacture a semiconductor device including TFTs including a polycrystalline semiconductor film by using the above-described method for manufacturing a semiconductor device. Such a semiconductor device may be used for controlling a display. Note that the subsequent manufacturing process will vary depending on the device that is eventually manufactured, and therefore its description is omitted.

<Organic EL Display>

Figure 21:
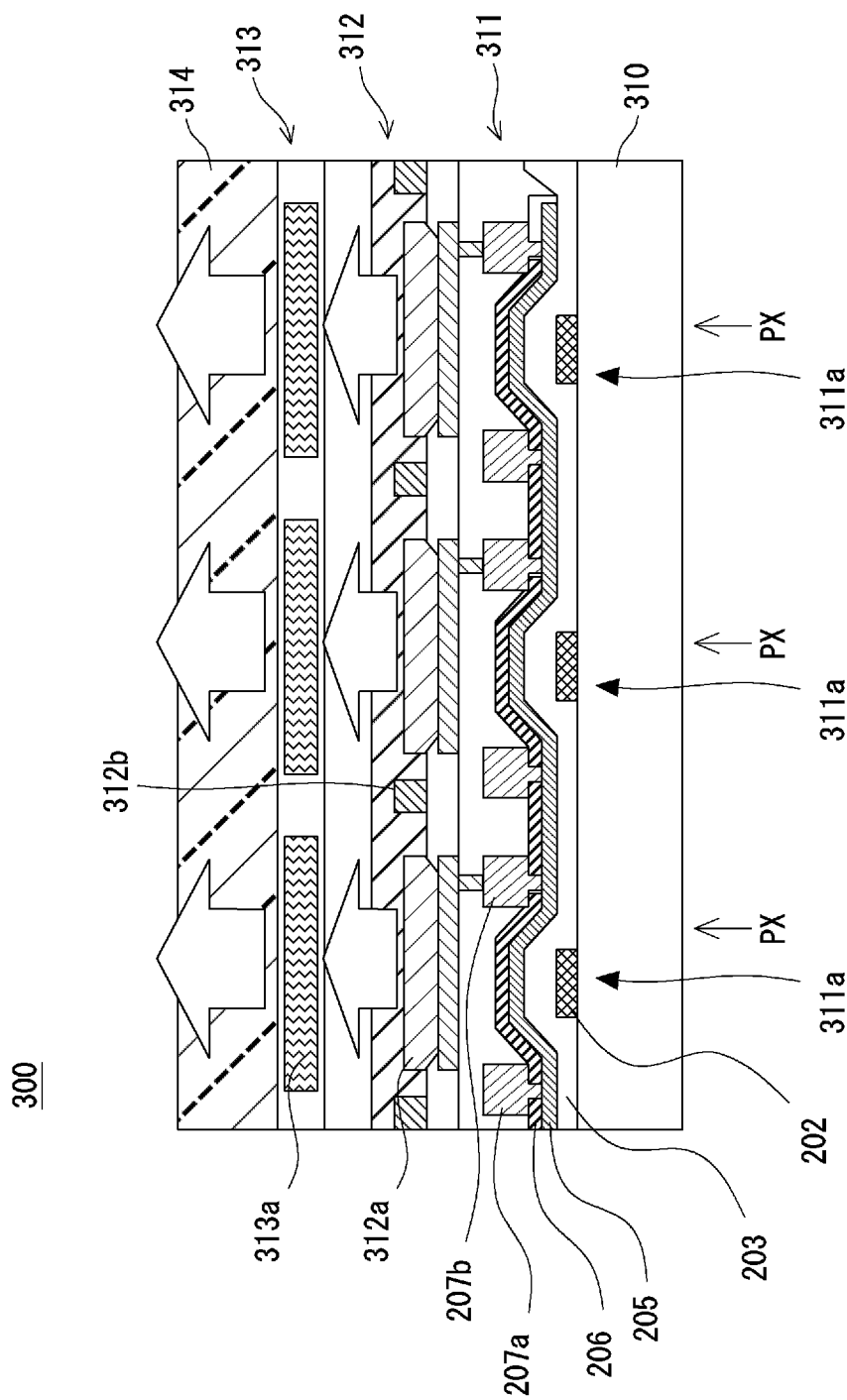
FIG. 21 is a cross-sectional view for explaining an outline of an organic EL (Electro Luminescence) display, and shows a pixel circuit of the organic EL display in a simplified manner.

Next, as an example of a device using a semiconductor device including TFTs, an organic EL display device is described. FIG. 21 is a cross section for explaining an outline of an organic EL display device, in which pixel circuits of the organic EL display device are illustrated in a simplified manner. The organic EL display device 300 shown in FIG. 21 is an active-matrix-type display device in which a TFT is disposed in each pixel Px.

The organic EL display device 300 includes a substrate 310, a TFT layer 311, an organic layer 312, a color filter layer 313, and a sealing substrate 314. FIG. 21 shows a top-emission-type organic EL display device, in which the side of the sealing substrate 314 is located on the viewing side. Note that the following description is given to show an example of a configuration of an organic EL display device and this embodiment is not limited to the below-described configuration. For example, a semiconductor device according to this embodiment may be used for a bottom-emission-type organic EL display device.

The substrate 310 is a glass substrate or a metal substrate. The TFT layer 311 is provided over the substrate 310. The TFT layer 311 includes TFTs 311a disposed in the respective pixels Px. Further, the TFT layer 311 includes wiring lines connected to the TFTs 311a, and the like. The TFTs 311a, the wirings, and the like constitute pixel circuits. Note that the TFT layer 311 corresponds to the TFT described above with reference to FIG. 20, and includes gate electrodes 202, a gate insulating film 203, a polysilicon film 205, an inter-layer insulating film 206, source electrodes 207a, and drain electrodes 207b.

The organic layer 312 is provided over the TFT layer 311. The organic layer 312 includes an organic EL light-emitting element 312a disposed in each pixel Px. The organic EL light-emitting element 312a has, for example, a laminated structure in which an anode, a hole injection layer, a hole transport layer, a light-emitting layer, an electron transport layer, an electron injection layer, and a cathode are laminated. In the case of the top emission type, the anode is a metal electrode and the cathode is a transparent conductive film made of ITO (Indium Tin Oxide) or the like. Further, in the organic layer 312, separation walls 312b for separating organic EL light-emitting elements 312a are provided between pixels Px.

The color filter layer 313 is provided over the organic layer 312. The color filter layer 313 includes color filters 313a for performing color displaying. That is, in each pixel PX, a resin layer colored in R (red), G (green), or B (blue) is provided as the color filter 313a. When white light emitted from the organic layer 312 passes through the color filters 313a, the white light is converted into light having RGB colors. Note that in the case of a three-color system in which organic EL light-emitting elements capable of emitting each color of RGB are provided in the organic layer 312, the color filter layer 313 may be unnecessary.

The sealing substrate 314 is provided over the color filter layer 313. The sealing substrate 314 is a transparent substrate such as a glass substrate and is provided to prevent deterioration of the organic EL light-emitting elements of the organic layer 312.

Electric currents flowing through the organic EL light-emitting elements 312a of the organic layer 312 are changed by display signals supplied to the pixel circuits. Therefore, it is possible to control an amount of light emitted in each pixel Px by supplying a display signal corresponding to a display image to each pixel Px. As a result, it is possible to display a desired image.

Note that although the organic EL display device has been described above as an example of a device using a semiconductor device including TFTs, the semiconductor device including TFTs may be other types of display devices such as a liquid crystal display device. Further, cases where the laser processing apparatus 1 according to this embodiment is applied to a laser annealing apparatus have been described above. However, the laser processing apparatus 1 according to this embodiment can also be applied to apparatuses other than the laser annealing apparatus.

The present invention made by the inventors of the present application has been explained above in a concrete manner based on embodiments. However, the present invention is not limited to the above-described embodiments, and needless to say, various modifications can be made without departing from the spirit and scope of the present invention.

Further, the below-described matters are also included in the scope of the technical idea according to the embodiment or the modified example.

(Supplementary Note 1)

A laser processing apparatus comprising:
  a stage including a top surface over which an object to be processed is moved from a vicinity of one end of the top surface to a vicinity of another end thereof along one direction in a plane parallel to the top surface;
  a laser irradiation unit configured to apply laser light to the object to be processed moving over the top surface; and
  a control unit configured to instruct a loading/unloading apparatus to place the object to be processed in a first position in the vicinity of the one end or in a second position in the vicinity of the one end, the loading/unloading apparatus being configured to place the object to be processed in the vicinity of the one end and unload the object to be processed from the vicinity of the other end, the second position being displaced from the first position in another direction orthogonal to the one direction by a predetermined length in a plane parallel to the top surface.

(Supplementary Note 2)

The laser processing apparatus described in Supplementary note 1, wherein the control unit selects the first position or the second position as a placement position of the object to be processed and instructs the loading/unloading to place the object to be processed in the selected placement position.

(Supplementary Note 3)

The laser processing apparatus described in Supplementary note 1, wherein when a loading/unloading control unit selects the first position or the second position as the placement position of the object to be processed, the control unit makes it possible to place the object to be processed in the placement position selected by the loading/unloading control unit, the loading/unloading control unit being configured to control loading/unloading of the object to be processed in the loading/unloading apparatus.

(Supplementary Note 4)

The laser processing apparatus described in any one of Supplementary notes 1 to 3, wherein
  the stage is disposed inside a processing chamber including a loading gate and an unloading gate different from the loading gate, and
  the control unit makes the loading/unloading apparatus carries in the object to be processed through the loading gate, places the object to be processed over the top surface, and carries out the object to be processed through the unloading gate.

(Supplementary Note 5)

The laser processing apparatus described in any one of Supplementary notes 1 to 4, wherein a part of the first position overlaps a part of the second position over the top surface.

(Supplementary Note 6)

The laser processing apparatus described in any one of Supplementary notes 1 to 5, wherein the laser light has a line beam shape extending in the other direction, and a length of an irradiation area on the object to be processed placed over the top surface in the other direction is longer than a length of the line beam, the irradiation area being an area that needs to be irradiated with the laser light.

(Supplementary Note 7)

The laser processing apparatus described in Supplementary note 6, wherein the irradiation area includes a first irradiation part, a second irradiation part, and a third irradiation part each of which can be irradiated with the laser light by one transfer of the object to be processed in the one direction, in the object to be processed, the second irradiation part is located between the first and third irradiation parts, when the object to be processed placed in the first position is moved in the one direction, the first or third irradiation part is irradiated with the laser light, and when the object to be processed placed in the second position is moved in the one direction, the second irradiation part is irradiated with the laser light.

(Supplementary Note 8)

The laser processing apparatus described in Supplementary note 6, wherein the irradiation area includes a first irradiation part and a second irradiation part each of which can be irradiated with the laser light by one transfer of the object to be processed in the one direction, when the object to be processed placed in the first position is moved in the one direction, the first irradiation part is irradiated with the laser light, and when the object to be processed placed in the second position is moved in the one direction, the second irradiation part is irradiated with the laser light.

(Supplementary Note 9)

The laser processing apparatus described in any one of Supplementary notes 1 to 8, wherein a length of the object to be processed placed over the top surface in the other direction is 2,220 [mm] or longer.

(Supplementary Note 10)

The laser processing apparatus described in any one of Supplementary notes 1 to 9, wherein holding means is provided in at least one of the first and second positions over the top surface, the holding means being configured to protrude from the top surface and hold the object to be processed.

(Supplementary Note 11)

The laser processing apparatus described in Supplementary note 10, wherein the holding means is accommodated below the top surface when the object to be processed is moved in the one direction.

(Supplementary Note 12)

The laser processing apparatus described in Supplementary note 11, wherein the stage comprises a grasping part disposed in the top surface, the grasping part being configured to grasp the object to be processed, and the holding means is accommodated in such a manner that the closer it is located to the grasping part, the earlier it is accommodated.

(Supplementary Note 13)

The laser processing apparatus described in any one of Supplementary notes 10 to 12, wherein the holding means is a pusher pin.

(Supplementary Note 14)

The laser processing apparatus described in any one of Supplementary notes 10 to 12, wherein the holding means is a bar.

(Supplementary Note 15)

The laser processing apparatus described in any one of Supplementary notes 1 to 9, wherein a groove is formed in the vicinity of the one end of the top surface and the vicinity of the other end thereof, the groove being formed so that an arm part of the loading/unloading apparatus is inserted thereinto, the arm part being configured to hold the object to be processed.

(Supplementary Note 16)

The laser processing apparatus described in any one of Supplementary notes 1 to 15, wherein the object to be processed comprises a substrate and a semiconductor film formed over the substrate.

(Supplementary Note 17)

A laser processing method comprising the steps of:

(a) placing an object to be processed in a first position in a vicinity of one end of a stage, the stage including a top surface over which the object to be processed is moved from the vicinity of the one end of the top surface to vicinity of another end thereof along one direction in a plane parallel to the top surface;

(b) moving the object to be processed from the vicinity of the one end of the top surface to the vicinity of the other end thereof along the one direction;

(c) applying laser light to the object to be processed moving over the top surface;

(d) unloading the object to be processed from the vicinity of the other end of the top surface;

(e) placing the object to be processed in a second position in the vicinity of the one end of the top surface, the second position being displaced from the first position in another direction orthogonal to the one direction by a predetermined length in a plane parallel to the top surface, and after the step (e), successively performing the step (b), the step (c), and the step (d).

(Supplementary Note 18)

The laser processing method described in Supplementary note 17, wherein a control unit configured to instruct a loading/unloading apparatus to place the object to be processed in the vicinity of the one end and unload the object to be processed from the vicinity of the other end is used, in the step (a), the control unit is made to instruct the loading/unloading apparatus to place the object to be processed in the first position, and in the step (e), the control unit is made to instruct the loading/unloading apparatus to place the object to be processed in the second position.

(Supplementary Note 19)

The laser processing method described in Supplementary note 18, wherein in the step (a), the control unit is made to select the first position as a placement position of the object to be processed and instruct the loading/unloading apparatus about the selected placement position, and in the step (e), the control unit is made to select the second position as the placement position of the object to be processed and instruct the loading/unloading apparatus about the selected placement position.

(Supplementary Note 20)

A method for manufacturing a semiconductor device, comprising the steps of:

(A) preparing an object to be processed including a substrate and an amorphous film formed over the substrate;

(B) crystallizing the amorphous film by irradiating the amorphous film with laser light, wherein the step (B) comprises the steps of:

(a) placing an object to be processed in a first position in a vicinity of one end of a stage, the stage including a top surface over which the object to be processed is moved from the vicinity of the one end of the top surface to vicinity of another end thereof along one direction in a plane parallel to the top surface;

(b) moving the object to be processed from the vicinity of the one end of the top surface to the vicinity of the other end thereof along the one direction;

(c) applying laser light to the object to be processed moving over the top surface;

(d) unloading the object to be processed from the vicinity of the other end of the top surface;

(e) placing the object to be processed in a second position in the vicinity of the one end of the top surface, the second position being displaced from the first position in another direction orthogonal to the one direction by a predetermined length in a plane parallel to the top surface, and after the step (e), successively performing the step (b), the step (c), and the step (d).

This application is based upon and claims the benefit of priority from Japanese patent application No. 2018-002460, filed on Jan. 11, 2018, the disclosure of which is incorporated herein in its entirety by reference.

REFERENCE SIGNS LIST 1, 100 LASER PROCESSING APPARATUS
10 STAGE
11 TOP SURFACE
11a FIRST POSITION
11b SECOND POSITION
11c THIRD POSITION
11d FOURTH POSITION
12 ONE END-VICINITY
13 OTHER END-VICINITY
14 PUSHER PIN
14a FIRST PUSHER PIN DRIVER
14b SECOND PUSHER PIN DRIVER
15 MOTION CONTROLLER
16 GRASPING PART
17a LOADING PORT
17b UNLOADING PORT
18 PROCESSING CHAMBER
20 LASER IRRADIATION PART
21 LINE BEAM
22 LASER IRRADIATION UNIT CONTROLLER
23 DOOR VALVE
24 LEVITATING UNIT CONTROLLER
25 XYθ-STAGE
26 BAR
27 GROOVE
28a OPTICAL SYSTEM HOUSING
28b MIRROR
28c ENCLOSED PART
28d GAS BOX
28e GAS INLET
28f GAS
28g IRRADIATION WINDOW
28h SEALING WINDOW
30 LOADING/UNLOADING APPARATUS
31 LOADING/UNLOADING CONTROL UNIT
32 ROTATING APPARATUS
33 ARM PART
34 CASSETTE
40 OBJECT TO BE TREATED
41 FIRST IRRADIATION PART
42 SECOND IRRADIATION PART
43 THIRD IRRADIATION PART
45 PANEL
50 CONTROL UNIT
51 MAIN CONTROL UNIT
52 SUB CONTROL SECTION

The invention claimed is:

1. A laser processing apparatus comprising:

a processing chamber configured to perform laser processing for an object to be processed;

a stage disposed inside the processing chamber, the stage being configured to convey the object to be processed; and a control unit configured to instruct a loading/unloading apparatus about a placement position of the object to be processed over the stage, the loading/unloading apparatus being configured to load/unload the object to be processed into/from the processing chamber, wherein the processing chamber comprises a loading gate for loading the object to be processed and an unloading gate for unloading the object to be processed;

the object to be processed is conveyed only in a first direction from the loading gate toward the unloading gate over the stage;

the loading/unloading apparatus being configured to carry the object to be processed into the processing chamber through the loading gate, place the object to be processed over a first end of the stage, and remove the object from the processing chamber through the unloading gate at a second end of the stage after laser processing, the loading/unloading apparatus being further configured to place the object to be processed over the first end of the stage at different positions based on position control signals received from the control unit, the different positions being positions along a second direction, the second direction intersecting the first direction, wherein the loading/unloading apparatus is configured to place the object to be processed at the first end of the stage at a first position based on a first position control signal from the control unit and unload the object from the processing chamber after the object has been first laser processed while conveyed along the first direction from the first position to the unloading gate, and the loading/unloading apparatus is further configured to place the object to be processed at the first end of the stage at a second position based on a second position control signal from the control unit so as to be second laser processed while conveyed along the first direction from the second position to the unloading gate, wherein the loading/unloading apparatus places the object at the second position based on the determination by the control unit that an irradiation area of the object has not been irradiated with laser light during the first laser processing of the object.

2. The laser processing apparatus according to claim 1, wherein the object to be processed has a rectangular planar shape, the laser light used for the laser processing has a line beam shape extending in the second direction over the top surface of the object to be processed, and a length of a side of the object to be processed along the second direction is longer than a length of the laser light in the second direction.

3. The laser processing apparatus according to claim 1, wherein the object to be processed is a glass substrate having an area of 2,160 mm×2,460 mm or larger.

4. The laser processing apparatus according to claim 1, wherein a loading holding part and an unloading holding part are provided over the stage, the loading holding part being adapted to be used when the loading/unloading apparatus loads the object to be processed, the unloading holding part being adapted to be used when the loading/unloading apparatus unloads the object to be processed.

5. The laser processing apparatus according to claim 4, wherein each of the loading holding part and the unloading holding part comprises a plurality of pusher pins, and the object to be processed is held by the plurality of pusher pins.

6. The laser processing apparatus according to claim 4, wherein each of the loading holding part and the unloading holding part is formed by a plurality of grooves, the loading/unloading apparatus comprises an arm part, and the object to be processed is loaded and unloaded by inserting the arm part into the plurality of grooves.

7. The laser processing apparatus according to claim 1, wherein the object to be processed is conveyed while being levitated over the stage.

8. A laser processing method comprising the steps of:
(a) transmitting, to a loading/unloading apparatus for an object to be processed in a processing chamber, a first position control signal for controlling a placement position of the object to be processed over a stage included in the processing chamber;
(b) carrying, by the loading/unloading apparatus, the object to be processed through a loading gate into the processing chamber and placing the object to be processed at a first position over the stage, the first position being a position determined by the first position control signal, and the first position being a position at a first end of the stage;
(c) conveying, in a first direction, the object to be processed to a laser light irradiation position over the stage;
(d) irradiating the object to be processed with laser light after the step (c), and determining that an irradiation area of the object to be processed has not been irradiated with the laser light; and
(e) unloading, by the loading/unloading apparatus, the object to be processed from the processing chamber after the step (d), the object to be processed having been conveyed only in the first direction between the first end of the stage and the unloading of the object;
(f) transmitting a second position control signal to the loading/unloading apparatus after the step (e), the second control signal relating to the determination made in step (d);
(g) placing, by the loading/unloading apparatus, the object to be processed that was unloaded from the processing chamber in a second position over the stage, the second position being a position determined by the second position control signal, the second position being a position at the first end of the stage that is different from the first position, the first and second positions being positions along a second direction;
(h) conveying the object to be processed to the laser light irradiation position over the stage;
(i) irradiating the object to be processed with laser light after the step (h); and
(j) unloading, by the loading/unloading apparatus, the object to be processed after the step (i), wherein in the steps (c) and (h), the first direction intersects the second direction and the object to be processed is moved in same direction in the steps (c) and (h).

9. The laser processing method according to claim 8, wherein the object to be processed is a glass substrate having an area of 2,160 mm×2,460 mm or larger.

10. A method for manufacturing a semiconductor device, comprising the steps of:
(A) preparing a substrate in which an amorphous semiconductor film is formed;
(B) transmitting, to a loading/unloading apparatus for the substrate, a first position control signal for controlling a placement position of the substrate over a stage included in a processing chamber;
(C) placing, by the loading/unloading apparatus, the substrate in a first position over the stage determined by the first position control signal, the first position being a position at a first end of the stage;
(D) conveying, in a first direction, the substrate over the stage to a laser light irradiation position over the stage;
(E) converting the amorphous semiconductor film into a polycrystalline state by irradiating the substrate with the laser light, and determining that an irradiation area of the substrate has not been irradiated with laser light;
(F) unloading, by the loading/unloading apparatus, the substrate from the processing chamber after the step (E), the substrate having been conveyed only in the first direction between the first end of the stage and the unloading of the substrate;
(G) transmitting a second position control signal to the loading/unloading apparatus after the step (F), the second control signal relating to the determination made in step (E);
(H) placing, by the loading/unloading apparatus, the substrate that was unloaded from the processing chamber in a second position over the stage, the second position being a position determined by the second position control signal, the second position being a position at the first end of the stage that is different from the first position, the first and second positions being positions along a second direction;

(I) conveying the substrate to the laser light irradiation position over the stage;
(J) irradiating the substrate with the laser light; and
(K) unloading, by the loading/unloading apparatus, the substrate after the step (J),
wherein
in the steps (D) and (I), the first direction intersect the second direction, and
the substrate is moved in same direction in the steps (D) and (I).

11. The method for manufacturing a semiconductor device according to claim 10, wherein in the step (A), the substrate is a glass substrate in which amorphous silicon is formed.

12. The method for manufacturing a semiconductor device according to claim 10, wherein a thin-film transistor including a polycrystalline semiconductor film is formed over the substrate after the step (E).

13. The method for manufacturing a semiconductor device according to claim 10, wherein the semiconductor device is configured to control a display.

14. The method for manufacturing a semiconductor device according to claim 10, wherein the substrate is a glass substrate having an area of 2,160 mm×2,460 mm or larger.

* * * * *